US011862476B2

United States Patent
Cho et al.

(10) Patent No.: US 11,862,476 B2
(45) Date of Patent: Jan. 2, 2024

(54) METHOD OF FORMING A SEMICONDUCTOR DEVICE INCLUDING AN ACTIVE REGION WITH VARIABLE ATOMIC CONCENTRATION OF OXIDE SEMICONDUCTOR MATERIAL

(71) Applicant: SAMSUNG ELECTRONICS CO., LTD., Suwon-si (KR)

(72) Inventors: Minhee Cho, Suwon-si (KR); Junsoo Kim, Seongnam-si (KR); Ho Lee, Yongin-si (KR); Chankyung Kim, Hwaseong-si (KR); Hei Seung Kim, Suwon-si (KR); Jaehong Min, Yongin-si (KR); Sangwuk Park, Hwaseong-si (KR); Woo Bin Song, Hwaseong-si (KR); Sang Woo Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 17/076,025

(22) Filed: Oct. 21, 2020

(65) Prior Publication Data
US 2021/0057417 A1    Feb. 25, 2021

Related U.S. Application Data

(63) Continuation of application No. 16/185,892, filed on Nov. 9, 2018, now Pat. No. 10,854,612.

(30) Foreign Application Priority Data

Mar. 21, 2018  (KR) .................. 10-2018-0032874
Jun. 21, 2018  (KR) .................. 10-2018-0071521

(51) Int. Cl.
*H01L 21/34* (2006.01)
*H10B 12/00* (2023.01)
(Continued)

(52) U.S. Cl.
CPC .............. *H01L 21/34* (2013.01); *H01L 21/02* (2013.01); *H01L 21/28* (2013.01); *H10B 12/053* (2023.02); *H10B 12/31* (2023.02); *H10B 12/482* (2023.02)

(58) Field of Classification Search
CPC ......... H01L 27/10808; H01L 27/10876; H01L 27/10885; H01L 27/10855;
(Continued)

(56) References Cited

U.S. PATENT DOCUMENTS 7,923,723 B2  4/2011  Hayashi et al.
9,123,750 B2  9/2015  Park et al.
(Continued)

FOREIGN PATENT DOCUMENTS

CN   102208452 A   10/2011
CN   102683388 A   9/2012
(Continued)

OTHER PUBLICATIONS

Communication dated Mar. 31, 2022 by the Korean Intellectual Property Office in counterpart Korean Patent Application No. 10-2018-0071521.

*Primary Examiner* — Shouxiang Hu
(74) *Attorney, Agent, or Firm* — Sughrue Mion, PLLC

(57) ABSTRACT

A semiconductor device can include a semiconductor substrate and an active region in the semiconductor substrate, where the active region can include an oxide semiconductor material having a variable atomic concentration of oxygen. A first source/drain region can be in the active region, where the first source/drain region can have a first atomic concentration of oxygen in the oxide semiconductor material. A second source/drain region can be in the active region spaced apart from first source/drain region and a channel region can be in the active region between the first source/
(Continued)

drain region and the second source/drain region, where the channel region can have a second atomic concentration of oxygen in the oxide semiconductor material that is less than the first atomic concentration of oxygen. A gate electrode can be on the channel region and extend between the first source/drain region and the second source/drain region.

16 Claims, 42 Drawing Sheets

(51) Int. Cl.
*H01L 21/02* (2006.01)
*H01L 21/28* (2006.01)

(58) Field of Classification Search
CPC ......... H01L 27/10891; H01L 27/10814; H01L 27/10879; H01L 27/115; H01L 29/24; H01L 29/66477; H01L 29/66795; H01L 29/785; H01L 21/336; H01L 21/02; H01L 21/34; H01L 21/28; H01L 21/203
See application file for complete search history.

(56) References Cited

U.S. PATENT DOCUMENTS

| | | | |
|---|---|---|---|
| 9,177,872 B2 | 11/2015 | Sandhu | |
| 9,196,616 B2 | 11/2015 | Kato et al. | |
| 9,209,092 B2 | 12/2015 | Yamazaki et al. | |
| 9,431,400 B2 | 8/2016 | Takemura | |
| 9,530,852 B2 | 12/2016 | Isobe et al. | |
| 9,559,193 B2 | 1/2017 | Isobe et al. | |
| 9,673,276 B2 | 6/2017 | Kim et al. | |
| 10,109,710 B2 | 10/2018 | Toriumi et al. | |
| 10,236,391 B2 | 3/2019 | Sakata et al. | |
| 10,326,025 B2 | 6/2019 | Yamazaki et al. | |
| 10,468,514 B2 | 11/2019 | Ozaki et al. | |
| 10,741,693 B2 | 8/2020 | Baeck | |
| 10,763,371 B2 | 9/2020 | Morosawa et al. | |
| 10,872,982 B2 | 12/2020 | Ohno et al. | |
| 11,139,359 B2 | 10/2021 | Yamazaki et al. | |
| 2005/0035404 A1 | 2/2005 | Yu et al. | |
| 2008/0283831 A1 | 11/2008 | Ryu et al. | |
| 2009/0065771 A1 | 3/2009 | Iwasaki et al. | |
| 2013/0221345 A1* | 8/2013 | Ohno | H01L 29/66969 257/43 |
| 2014/0030846 A1* | 1/2014 | Akimoto | H01L 29/78606 438/104 |
| 2016/0027098 A1 | 1/2016 | Thornton | |
| 2016/0141381 A1 | 5/2016 | Kim et al. | |
| 2017/0062541 A1 | 3/2017 | Ishiyama et al. | |
| 2017/0256654 A1* | 9/2017 | Yamazaki | H01L 29/7869 |
| 2019/0006374 A1 | 1/2019 | Liaw | |

FOREIGN PATENT DOCUMENTS

| | | |
|---|---|---|
| CN | 103066130 A | 4/2013 |
| CN | 103872138 A | 6/2014 |
| CN | 104064594 A | 9/2014 |
| CN | 106935655 A | 7/2017 |
| JP | 2014-7311 A | 1/2014 |
| JP | 2015-5705 A | 1/2015 |
| KR | 10-2008-0103572 A | 11/2008 |
| KR | 10-2010-0014167 A | 2/2010 |
| KR | 10-2013-0025973 A | 3/2013 |
| KR | 10-2013-0098924 A | 9/2013 |
| KR | 10-1788415 | 10/2017 |
| WO | 2012/050873 A2 | 4/2012 |
| WO | 2013/177856 A1 | 12/2013 |
| WO | 2016/072398 A1 | 5/2016 |

* cited by examiner

US 11,862,476 B2

METHOD OF FORMING A SEMICONDUCTOR DEVICE INCLUDING AN ACTIVE REGION WITH VARIABLE ATOMIC CONCENTRATION OF OXIDE SEMICONDUCTOR MATERIAL

CROSS-REFERENCE TO RELATED APPLICATIONS

This is a continuation of U.S. application Ser. No. 16/185,892 filed Nov. 9, 2018, which is a U.S. non-provisional application which claims priority under 35 U.S.C. § 119 to Korean Patent Application No. 10-2018-0032874 filed on Mar. 21, 2018 and to Korean Patent Application No. 10-2018-00715121; filed Jun. 21, 2018 in the Korean Intellectual Property Office, the entire contents of which are hereby incorporated herein by reference.

BACKGROUND

Inventive concepts relate to a semiconductor device, and more particularly, to a semiconductor device including a data storage element.

Semiconductor devices have an important role in the electronic industry because of their small size, multi-functionality, and/or low fabrication cost. Data storage devices among the semiconductor devices can store logic data. The data storage devices are increasingly integrated with the development of the electronic industry. As a result, line widths of components constituting the data storage devices continue to decrease.

Additionally, high reliability has been demanded with the high integration of the data storage devices. However, the high integration may reduce the reliability of the data storage devices. Therefore, various studies have been conducted to improve the reliability of the data storage devices.

SUMMARY

Some embodiments of inventive concepts provide a semiconductor device with improved electrical characteristics. Pursuant to these embodiments, a semiconductor device can include a semiconductor substrate and an active region in the semiconductor substrate, where the active region can include an oxide semiconductor material having a variable atomic concentration of oxygen. A first source/drain region can be in the active region, where the first source/drain region can have a first atomic concentration of oxygen in the oxide semiconductor material. A second source/drain region can be in the active region spaced apart from first source/drain region and a channel region can be in the active region between the first source/drain region and the second source/drain region, where the channel region can have a second atomic concentration of oxygen in the oxide semiconductor material that is less than the first atomic concentration of oxygen. A gate electrode can be on the channel region and extend between the first source/drain region and the second source/drain region.

In some embodiments, a semiconductor device can include a semiconductor substrate and an active region in the semiconductor substrate, where the active region can include InGaZnO having a variable atomic concentration of oxygen ranging from about 3.8 to about 4.1. A first source/drain region can be in the active region, where the first source/drain region having a first atomic concentration of oxygen in the InGaZnO. A second source/drain region can be in the active region spaced apart from first source/drain region. A channel region can be in the active region between the first source/drain region and the second source/drain region, where the channel region can have a second atomic concentration of oxygen in the InGaZnO that is less than the first atomic concentration of oxygen. A gate electrode can be on the channel region and extend between the first source/drain region and the second source/drain region.

In some embodiments, a finFET semiconductor device can include a semiconductor substrate and an active fin structure protruding from the semiconductor substrate, where the active fin structure can include InGaZnO having a variable atomic concentration of oxygen ranging from about 3.8 to about 4.1. A first source/drain region can be in the active fin structure, where the first source/drain region can have a first atomic concentration of oxygen in the InGaZnO. A second source/drain region can be in the active fin structure spaced apart from first source/drain region. A channel region can be in the active fin structure between the first source/drain region and the second source/drain region, where the channel region can have a second atomic concentration of oxygen in the InGaZnO that is different from the first atomic concentration of oxygen. A gate electrode can cross the active fin structure opposite the channel region and extend between the first source/drain region and the second source/drain region.

DETAILED DESCRIPTION OF EMBODIMENTS

Figure 1:
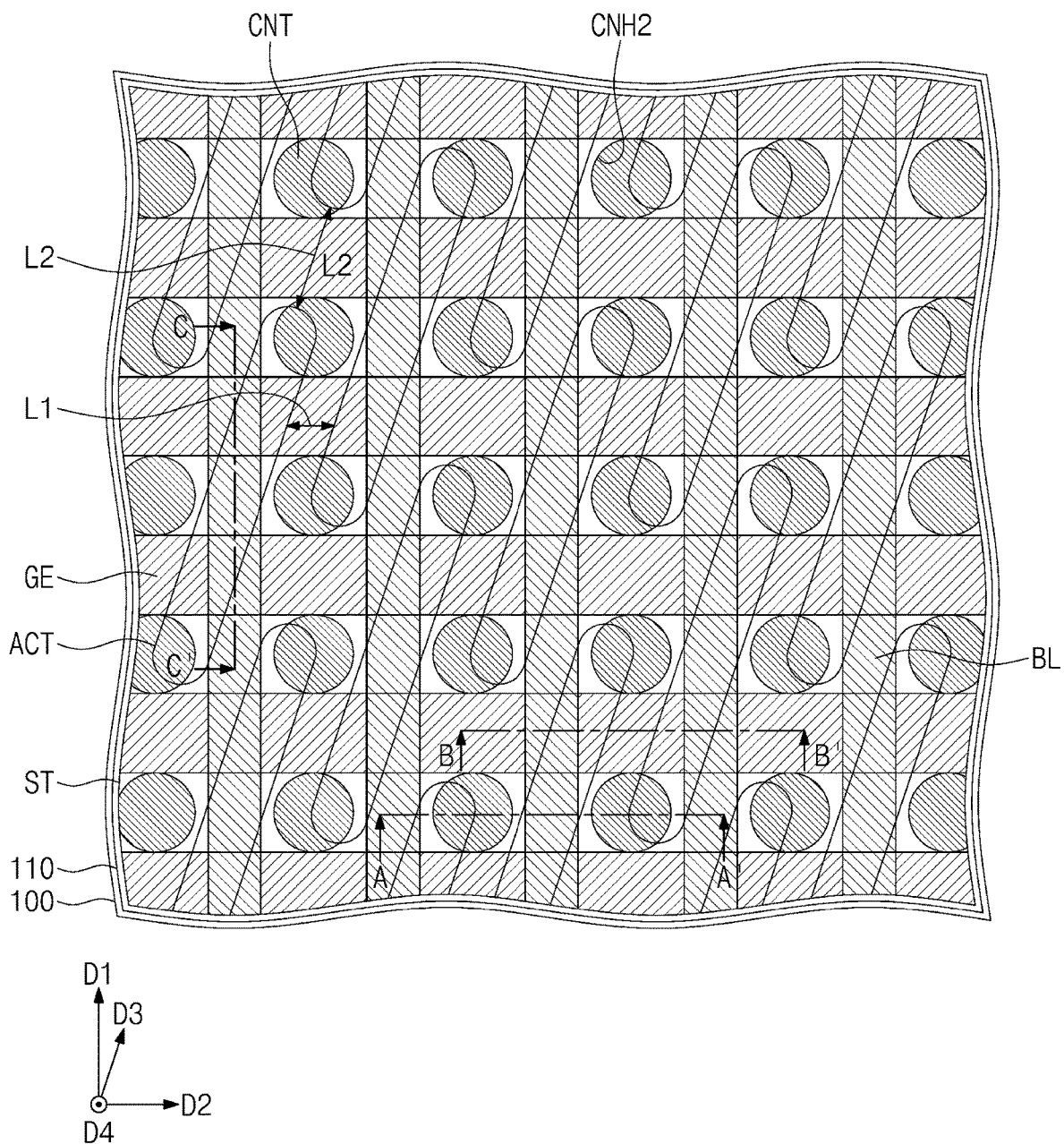
FIG. 1 illustrates a plan view showing a semiconductor device according to exemplary embodiments of inventive concepts.
Figure 2A:
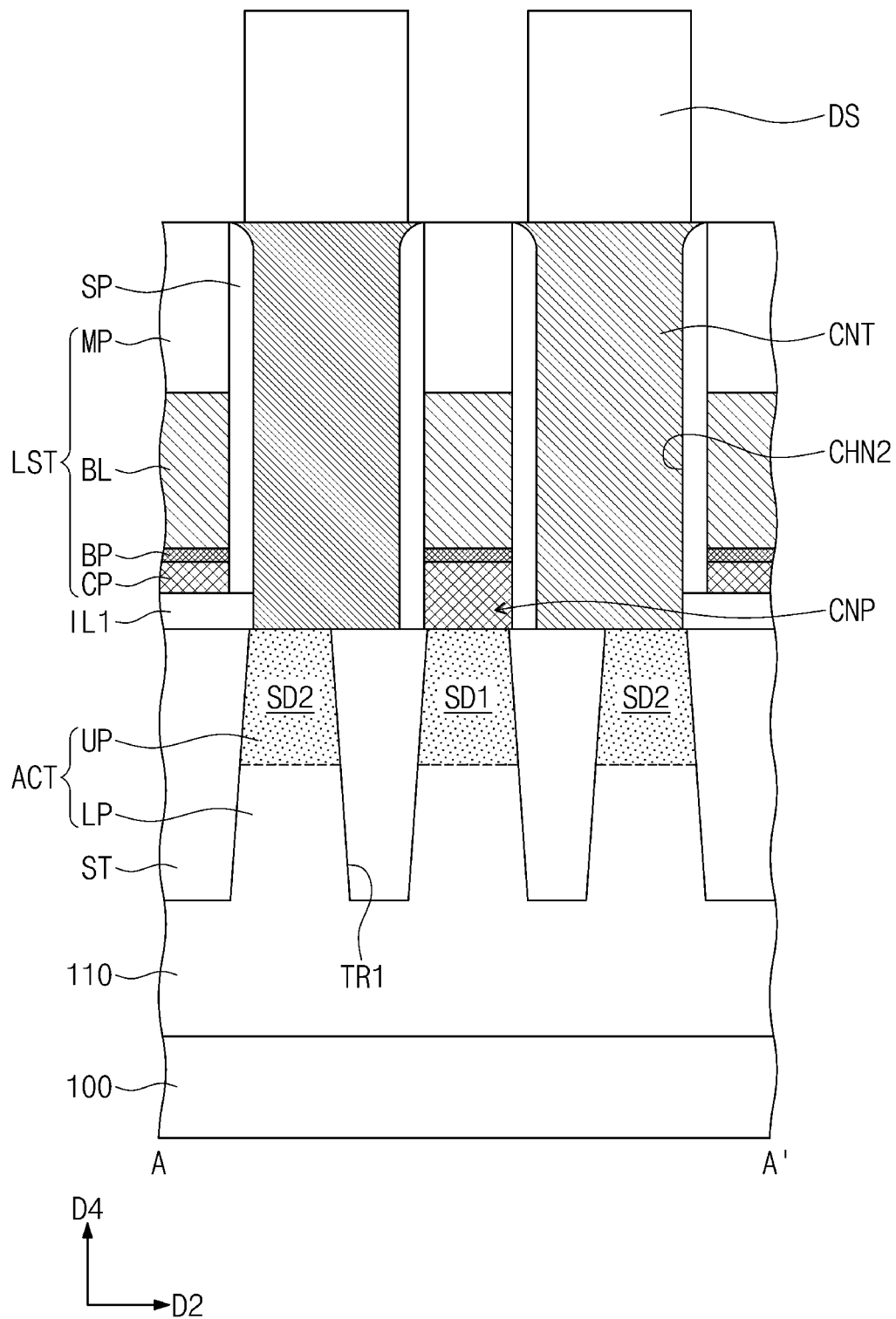
FIGS. 2A, 2B, and 2C illustrate cross-sectional views respectively taken along lines A-A', B-B', and C-C' of FIG. 1.
Figure 2B:
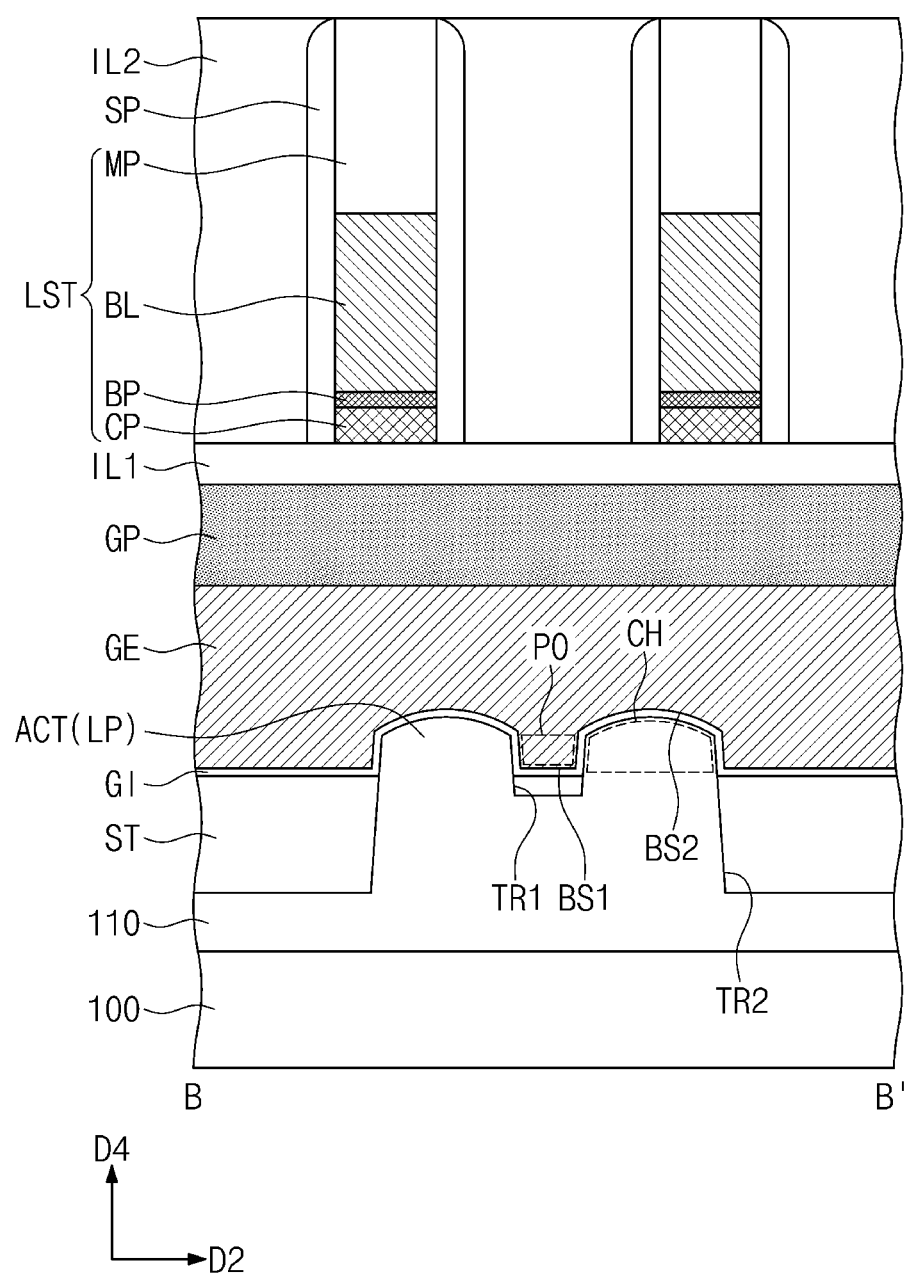
Figure 2C:
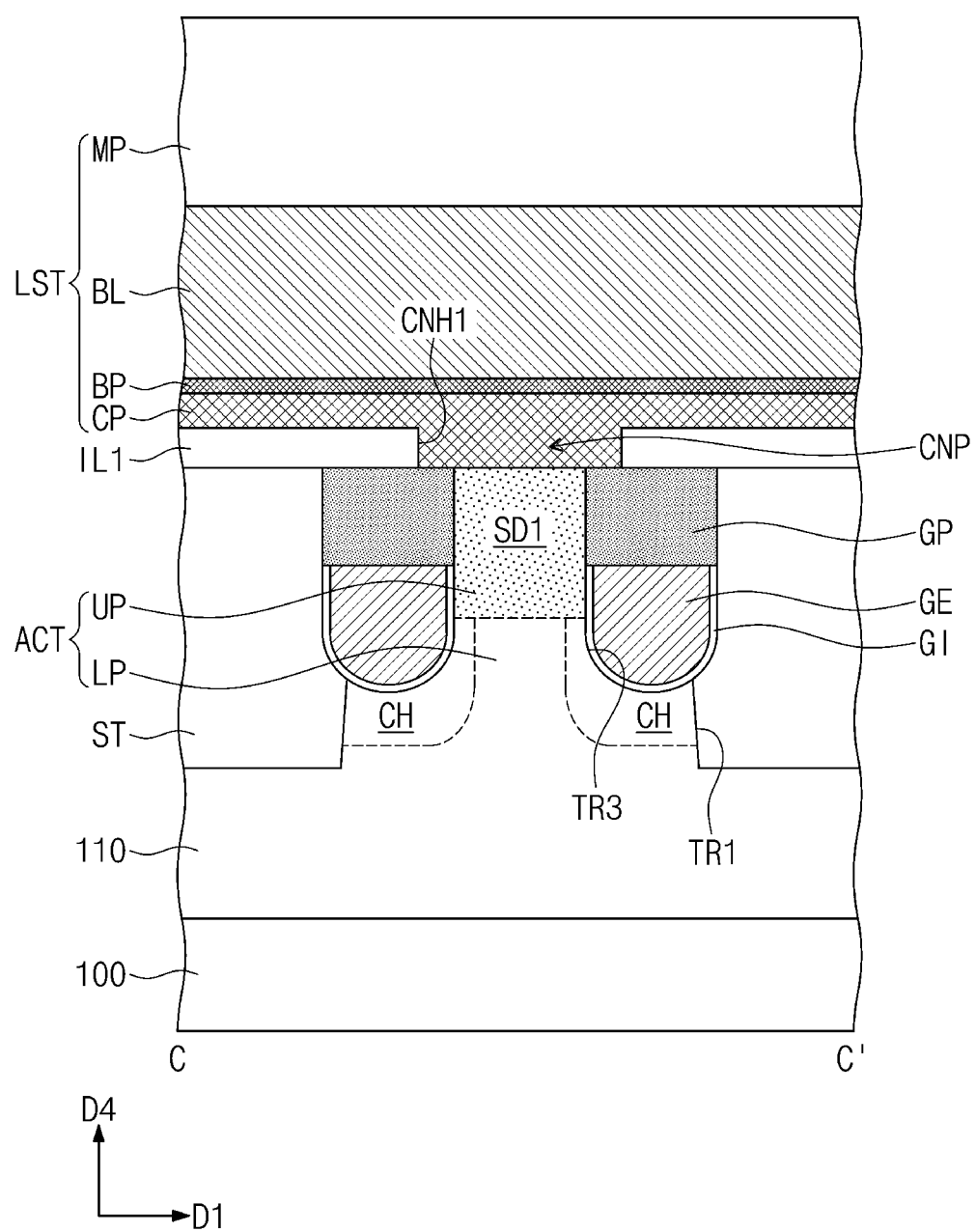
Figure 3:
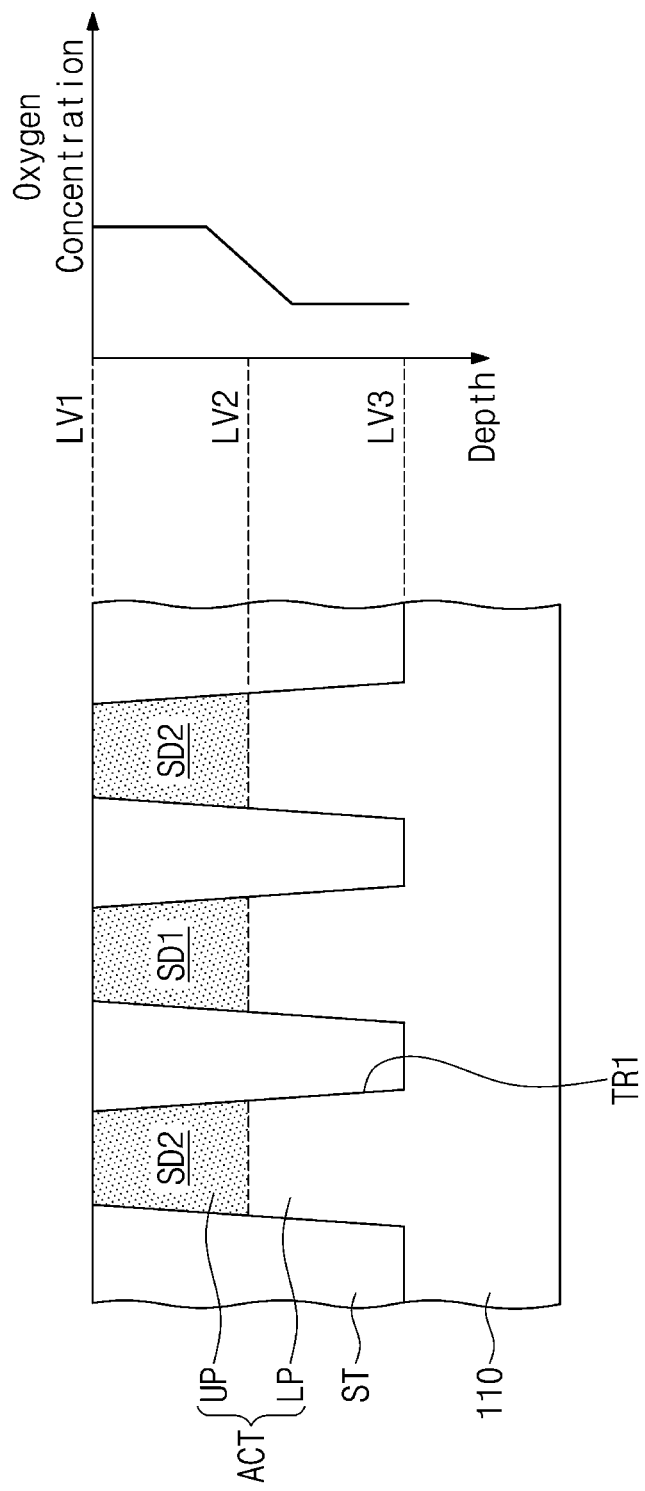
FIG. 3 illustrates a graph showing an oxygen concentration versus a depth of an active pattern, according to exemplary embodiments of inventive concepts.

FIG. 1 illustrates a plan view showing a semiconductor device according to exemplary embodiments of inventive concepts. FIGS. 2A, 2B, and 2C illustrate cross-sectional views respectively taken along lines A-A', B-B', and C-C' of FIG. 1. FIG. 3 illustrates a graph showing an oxygen concentration versus a depth of an active pattern, according to exemplary embodiments of inventive concepts. The semiconductor device shown in FIGS. 1 to 3 may be formed of at least a planar transistor such as a fin field-effect transistor (finFET).

Referring to FIGS. 1, 2A to 2C, and 3, a first semiconductor layer 110 may be provided on a substrate 100. The first semiconductor layer 110 may include an amorphous oxide semiconductor (AOS). The first semiconductor layer 110 may include a compound of oxygen (O) and at least two metals selected from a group consisting of zinc (Zn), indium (In), gallium (Ga), and tin (Sn). For example, the first semiconductor layer 110 may include indium-gallium-zinc oxide (IGZO) or indium-tin-zinc oxide (ITZO). The substrate 100 may be a semiconductor substrate including silicon, germanium, or silicon-germanium.

The first semiconductor layer 110 may be provided thereon with a device isolation layer ST defining active patterns ACT. For example, the device isolation layer ST may include a silicon oxide layer. The active patterns ACT may be formed when an upper portion of the first semiconductor layer 110 is patterned. Each of the active patterns ACT may thus include an amorphous oxide semiconductor identical to that of the first semiconductor layer 110. Each of the active patterns ACT may extend in a third direction D3 parallel to a top surface of the substrate 100. The active patterns ACT may be spaced apart from each other in the third direction D3. The active patterns ACT may be two-dimensionally arranged.

Each of the active patterns ACT may have a width that decreases toward a vertical direction (i.e., a fourth direction D4) to the top surface of the substrate 100. The width of each of the active patterns ACT may decrease with increasing distance from a bottom surface of the substrate 100.

First and second trenches TR1 and TR2 may be defined between the active patterns ACT. The device isolation layer ST may fill the first and second trenches TR1 and TR2 between the active patterns ACT. The first trench TR1 may be defined between a pair of active patterns ACT adjacent to each other in a second direction D2. The second trench TR2 may be defined between a pair of active patterns ACT adjacent to each other in the third direction D3.

A first length L1 may be provided between the pair of active patterns ACT adjacent to each other in the second direction D2. A second length L2 may be provided between the pair of active patterns ACT adjacent to each other in the third direction D3. The second length L2 may be greater than the first length L1. Therefore, the second trench TR2 may have a depth from top surfaces of the active patterns ACT greater than that of the first trench TR1. For example, the second trench TR2 may have a floor lower than that of the first trench TR1.

Each of the active patterns ACT may include a first segment LP and a second segment UP on the first segment LP. For example, the first segment LP may be a lower portion of the active pattern ACT, and the second segment UP may be an upper portion of the active pattern ACT.

The first segment LP may have an oxygen concentration less than that of the second segment UP. As shown in FIG. 3, the second segment UP may have a top surface at a first level LV1, the first segment LP may have a bottom surface at a third level LV3, and the first and second segments LP and UP may have therebetween a boundary at a second level LV2. The active pattern ACT may have an oxygen concentration that decreases from the first level LV1 toward the third level LV3. The oxygen concentration may rapidly decrease at the second level LV2.

Referring back to FIGS. 1 and 2A to 2C, each of the active patterns ACT may include a first source/drain region SD1 and a pair of second source/drain regions SD2. For example, the second segment UP of the active pattern ACT may include the first source/drain region SD1 and the pair of second source/drain regions SD2. The first source/drain region SD1 may be placed between the pair of second source/drain regions SD2.

A pair of third trenches TR3 may be defined on each of the active patterns ACT. Each of the third trenches TR3 may be defined between the first source/drain region SD1 and the second source/drain region SD2. The third trench TR3 may downwardly extend from the top surface of the active pattern ACT toward the substrate 100, while penetrating the second segment UP of the active pattern ACT. The third trench TR3 may have a floor higher than those of the first and second trenches TR1 and TR2.

Each of the active patterns ACT may further include a pair of channel regions CH. For example, the first segment LP of the active pattern ACT may include the pair of channel regions CH. When viewed in plan, the channel region CH may be interposed between the first source/drain region SD1 and the second source/drain region SD2. The channel region CH may be placed below the third trench TR3. The channel region CH may thus be positioned lower than the first and second source/drain regions SD1 and SD2.

Gate electrodes GE may be provided to run across the active patterns ACT and the device isolation layer ST. The gate electrodes GE may be provided in the third trenches TR3. The gate electrodes GE may extend in parallel to each other in the second direction D2. A pair of gate electrodes GE may be provided on the pair of channel regions CH of each of the active patterns ACT. The gate electrode GE may have a top surface lower than that of the active pattern ACT (e.g., a top surface of the first source/drain region SD1 or a top surface of the second source/drain region SD2).

Referring back to FIG. 2C, the gate electrode GE may have an upper portion adjacent to the second segment UP of the active pattern ACT. The gate electrode GE may have a lower portion adjacent to the first segment LP of the active pattern ACT. For example, the lower portion of the gate electrode GE may be adjacent to the channel region CH.

As the amorphous oxide semiconductor constituting the active pattern ACT increases in oxygen concentration, a transistor may increase in threshold voltage. For example, when a transistor is provided on an active pattern consisting of a first amorphous oxide semiconductor having a first oxygen concentration, and when the transistor has a first threshold voltage, the first amorphous oxide semiconductor may be defined to have the first threshold voltage. When a transistor is provided on an active pattern consisting of a second amorphous oxide semiconductor having a second oxygen concentration, and when the transistor has a second threshold voltage, the second amorphous oxide semiconductor may be defined to have the second threshold voltage. When the second oxygen concentration is greater than the first oxygen concentration, the second threshold voltage may be greater than the first threshold voltage.

As the amorphous oxide semiconductor increases in oxygen concentration, the amorphous oxide semiconductor may also increase in resistance. In contrast, as the amorphous oxide semiconductor decreases in oxygen concentration, the transistor may decrease in threshold voltage and resistance.

According to some exemplary embodiments of inventive concepts, the second segment UP of the active pattern ACT may have a relatively high oxygen concentration. When a threshold voltage is raised due to an increase in oxygen concentration, a current leakage may be reduced. The second segment UP may have a relatively high threshold voltage, and consequently, a current leakage may be prevented at the second segment UP adjacent to the upper portion of the gate electrode GE, which can be referred to as a gate-induced-drain leakage region.

According to some exemplary embodiments of inventive concepts, the first segment LP of the active pattern ACT may have a relatively low oxygen concentration. When a threshold voltage is reduced due to a decrease in oxygen concentration, a resistance may be decreased and a current may smoothly flow. The first segment LP may have a relatively low threshold voltage, and consequently, a current boosting effect may occur at the channel region CH of the first segment LP. For example, a relatively large amount of current may flow through the channel region CH under a predetermined gate voltage.

Referring back to FIG. 2B, the channel region CH below the gate electrode GE may vertically protrude beyond the device isolation layer ST below the gate electrode GE. For example, the channel region CH below the gate electrode GE may be located at a level higher than that of a top surface of the device isolation layer ST below the gate electrode GE. The channel region CH below the gate electrode GE may have a fin shape. The gate electrode GE may have a first bottom surface BS1 on the device isolation layer ST and a second bottom surface BS2 on the channel region CH, and the first bottom surface BS1 may be lower than the second bottom surface BS2.

At least a portion PO of the gate electrode GE may be interposed between a pair of channel regions CH adjacent to each other in the second direction D2. The portion PO of the gate electrode GE may be placed on the device isolation layer ST filling the first trench TR1. The gate electrode GE may surround a top surface and opposite sidewalls of the channel region CH, which may result in improving electrical characteristics of a transistor.

Referring back to FIGS. 1 and 2A to 2C, a gate dielectric layer GI may be interposed between the gate electrode GE and the active pattern ACT. A gate capping layer GP may be provided on the gate electrode GE. The gate capping layer GP may cover the top surface of the gate electrode GE. The gate capping layer GP may have a top surface coplanar with that of the active pattern ACT.

The gate electrode GE may include one or more of conductive metal nitride (e.g., titanium nitride or tantalum nitride) and metal (e.g., titanium, tantalum, tungsten, copper, or aluminum). For example, the gate electrode GE may be formed of a metal layer and a polysilicon high-work function layer formed thereon. The gate dielectric layer GI may include one or more of a silicon oxide layer, a silicon nitride layer, a silicon oxynitride layer, and a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. The gate capping layer GP may include one or more of a silicon oxide layer, a silicon nitride layer, and a silicon oxynitride layer.

A first interlayer dielectric layer IL1 may be provided on the substrate 100. The first interlayer dielectric layer IL1 may include first contact holes CNH1 exposing the first source/drain regions SD1 of the active patterns ACT.

The first interlayer dielectric layer IL1 may be provided thereon with line structures LST extending in a first direction D1. The line structures LST may be spaced apart from each other in the second direction D2. When viewed in plan, the line structures LST may intersect the gate electrodes GE. A pair of spacers SP may be provided on opposite sidewalls of each of the line structures LST. The spacers SP may include one or more of a silicon oxide layer, a silicon nitride layer, and a silicon oxynitride layer.

Each of the line structures LST may include a conductive pattern CP, a barrier pattern BP, a bit line BL, and a mask pattern MP that are sequentially stacked. The conductive pattern CP may include a contact part CNP that fills the first contact hole CNH1 and contacts the first source/drain region SD1. The barrier pattern BP may prevent a metallic material in the bit line BL from diffusing toward the conductive pattern CP. The bit line BL may be electrically connected to the first source/drain region SD1 through the barrier pattern BP and the conductive pattern CP.

The conductive pattern CP may include one of a doped semiconductor material (e.g., doped silicon or doped germanium), a metallic material (e.g., titanium, tantalum, tungsten, copper, or aluminum), and a metal-semiconductor compound (e.g., tungsten silicide, cobalt silicide, or titanium silicide). The barrier pattern BP may include conductive metal nitride (e.g., titanium nitride or tantalum nitride). The bit line BL may include a metallic material (e.g., titanium, tantalum, tungsten, copper, or aluminum).

A second interlayer dielectric layer IL2 may be provided on the first interlayer dielectric layer IL1. The second interlayer dielectric layer IL2 may cover the spacers SP. Second contact holes CNH2 may be provided to penetrate the second and first interlayer dielectric layer IL2 and IL1 and to expose the second source/drain regions SD2.

Contacts CNT may be provided in the second contact holes CNH2. The contacts CNT may contact the second source/drain regions SD2. The spacers SP may separate the contacts CNT from the bit lines BL. The contacts CNT may include one or more of conductive metal nitride (e.g., titanium nitride or tantalum nitride) and metal (e.g., titanium, tantalum, tungsten, copper, or aluminum).

A data storage element DS may be provided on each of the contacts CNT. The data storage element DS may be a memory element using one of a capacitor, a magnetic tunnel junction pattern, and a variable resistance body that includes a phase change material. For example, the data storage element DS may be a capacitor to form at least one of various types of memory such as dynamic random access memory (DRAM), not being limited thereto.

FIGS. 4, 6, 8, 10, 12, and 14 illustrate plan views showing a method of fabricating a semiconductor device according to exemplary embodiments of inventive concepts. FIGS. 5, 7A, 9A, 11A, 13A, and 15A illustrate cross-sectional views taken along line A-A' of FIGS. 4, 6, 8, 10, 12, and 14, respectively. FIGS. 7B, 9B, 11B, 13B, and 15B illustrate cross-sectional views taken along line B-B' of FIGS. 6, 8, 10, 12, and 14, respectively. FIGS. 7C, 9C, 11C, 13C, and 15C illustrate cross-sectional views taken along line C-C' of FIGS. 6, 8, 10, 12, and 14, respectively.

Figure 4:
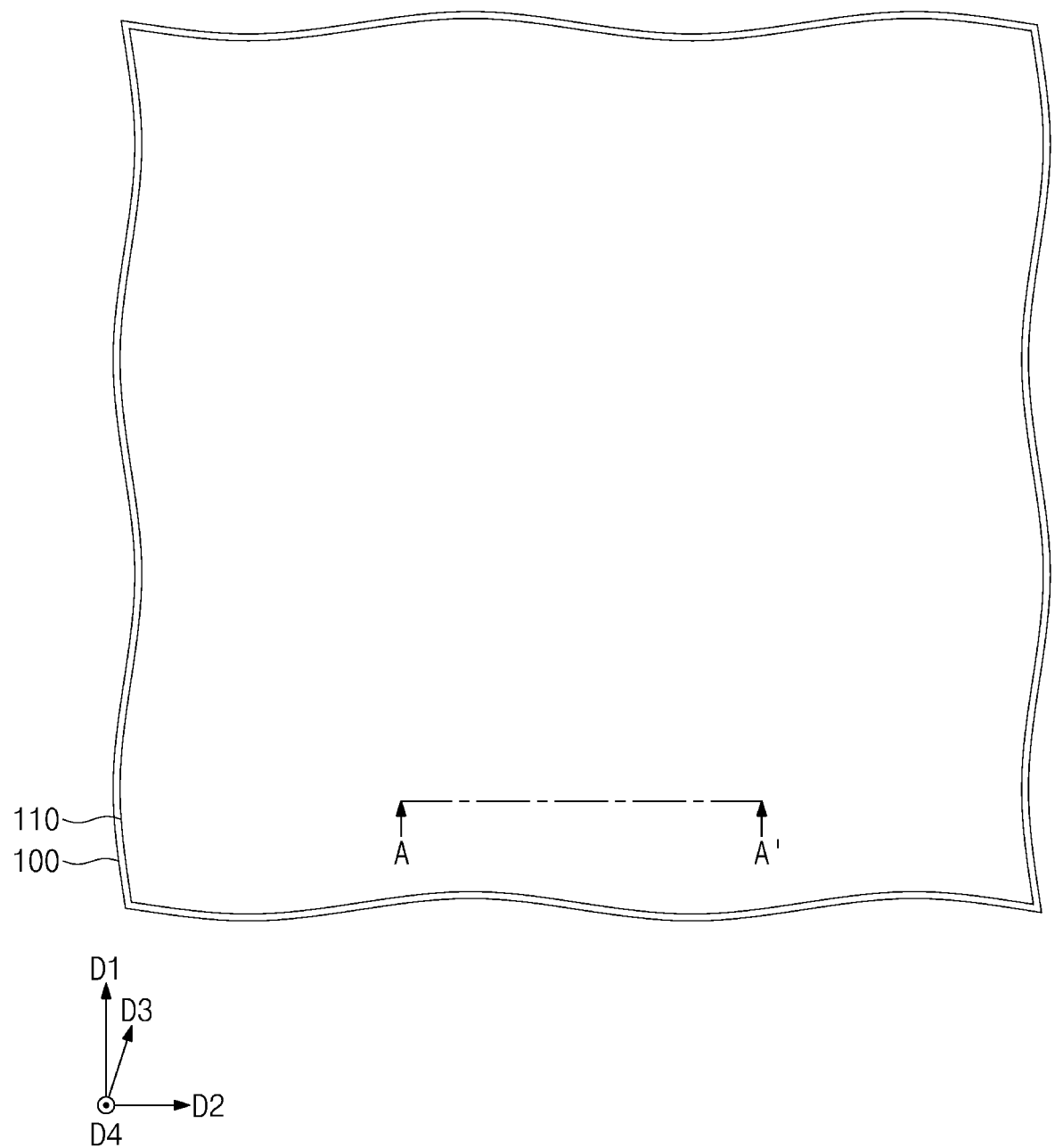
FIGS. 4, 6, 8, 10, 12, and 14 illustrate plan views showing a method of fabricating a semiconductor device according to exemplary embodiments of inventive concepts.
Figure 5:
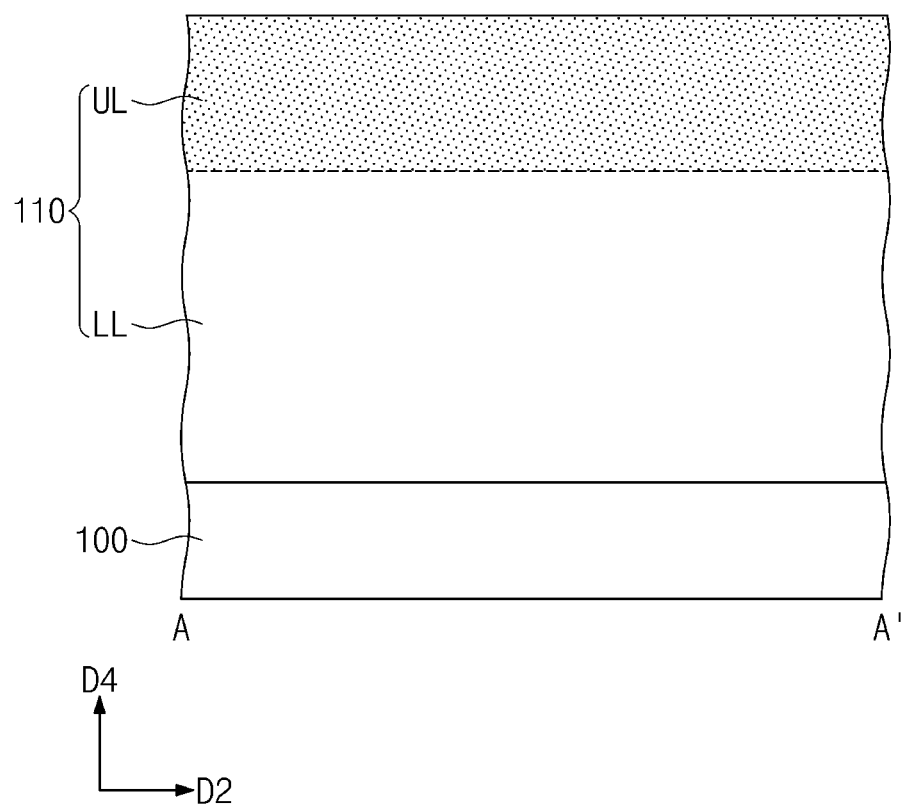
FIGS. 5, 7A, 9A, 11A, 13A, and 15A illustrate cross-sectional views taken along line A-A' of FIGS. 4, 6, 8, 10, 12, and 14, respectively.
Figure 6:
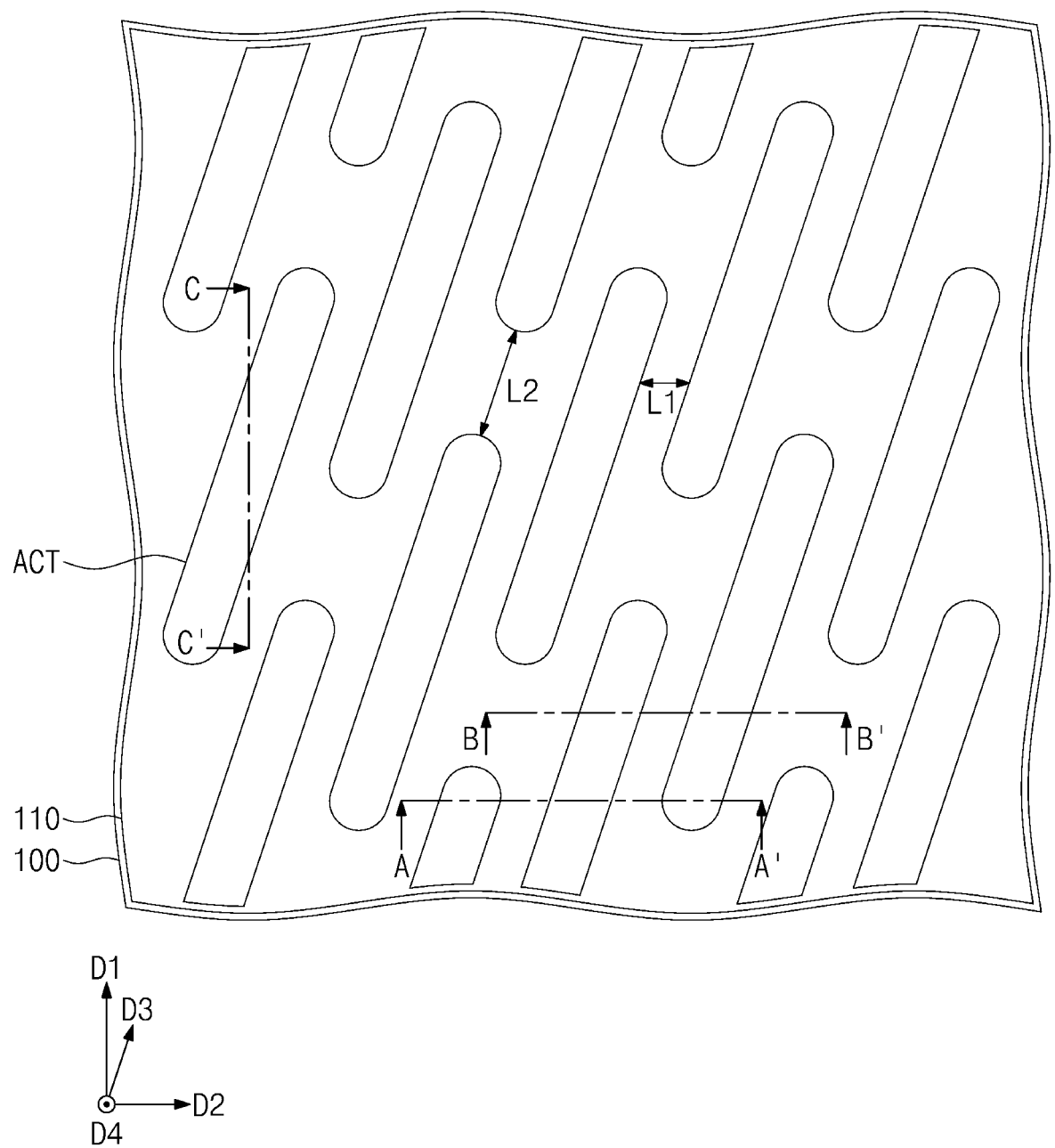
Figure 7A:
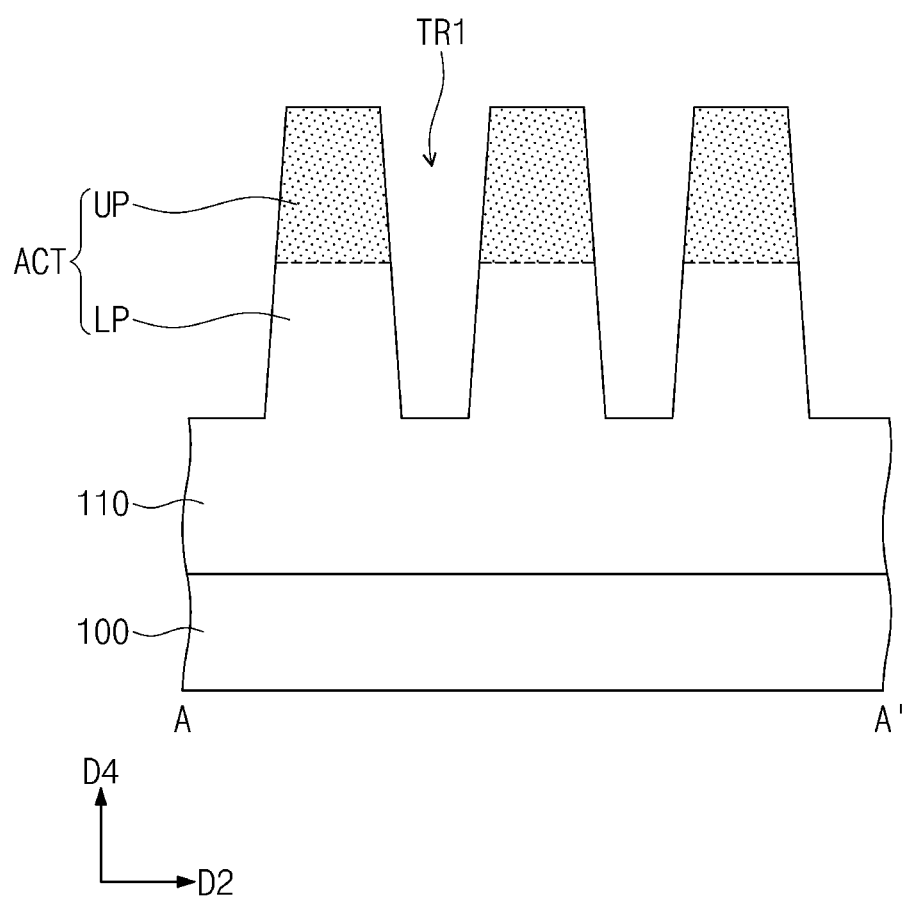
Figure 7B:
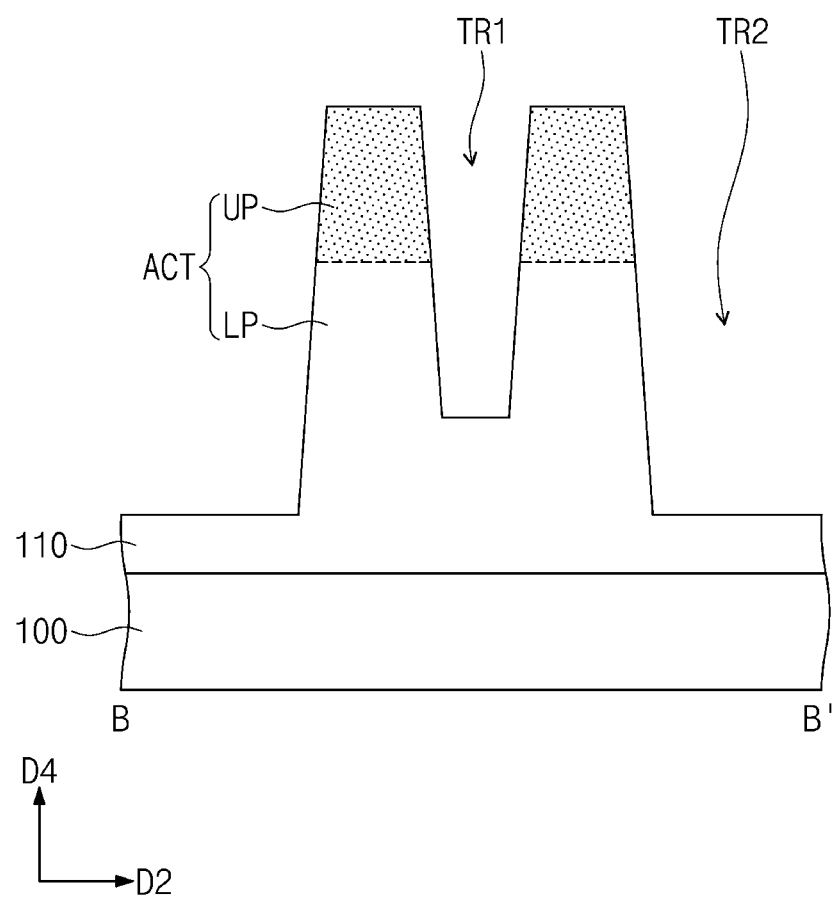
FIGS. 7B, 9B, 11B, 13B, and 15B illustrate cross-sectional views taken along line B-B' of FIGS. 6, 8, 10, 12, and 14, respectively.
Figure 7C:
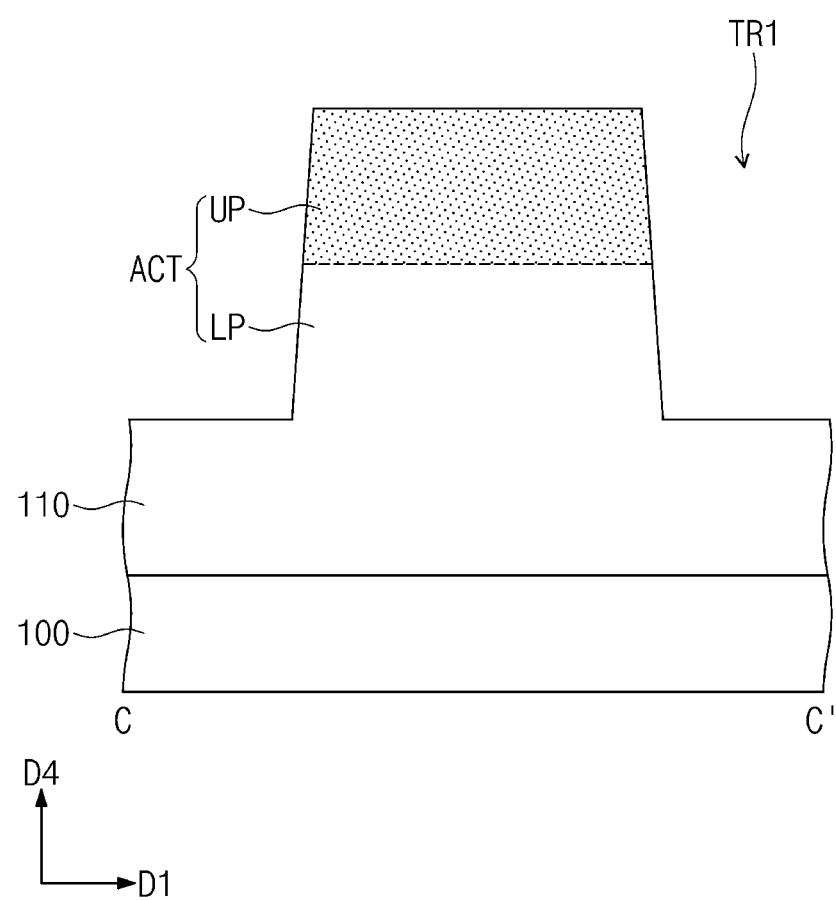
FIGS. 7C, 9C, 11C, 13C, and 15C illustrate cross-sectional views taken along line C-C' of FIGS. 6, 8, 10, 12, and 14, respectively.
Figure 8:
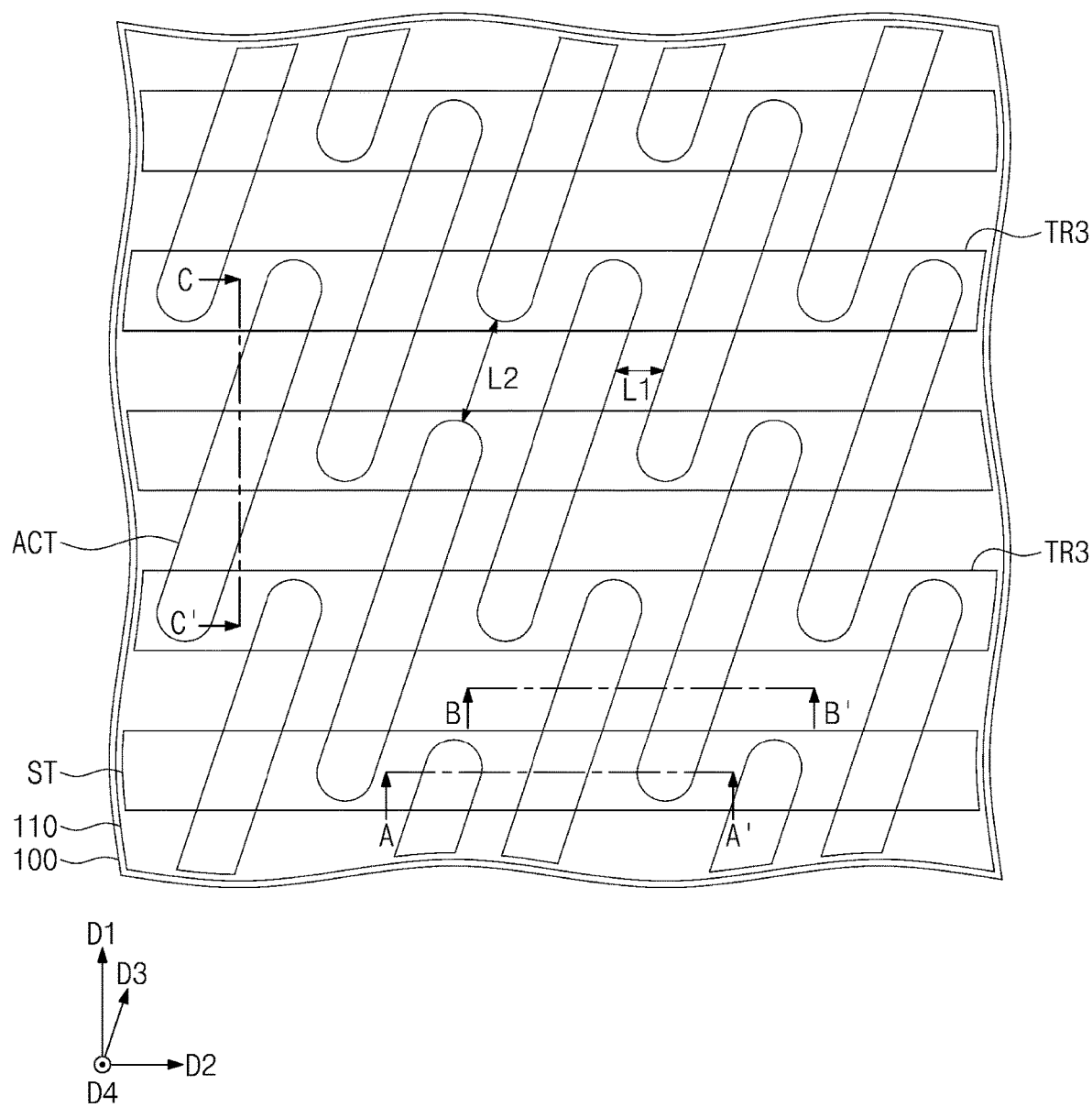

Referring to FIGS. 4 and 5, a first semiconductor layer 110 may be formed on a substrate 100. For example, a sputtering process may be used to form the first semiconductor layer 110. A target of the sputtering process may include a precursor of an amorphous oxide semiconductor. The target may include at least two metals selected from a group consisting of zinc (Zn), indium (In), gallium (Ga), and tin (Sn). In consequence, the first semiconductor layer 110 may be formed of the amorphous oxide semiconductor (e.g., indium-gallium-zinc oxide (IGZO) or indium-tin-zinc oxide (ITZO)).

The formation of the first semiconductor layer 110 may include forming a first layer LL on the substrate 100 and forming a second layer UL on the first layer LL. The formation of the first layer LL may include performing a sputtering process under a first partial pressure of oxygen (O2). The formation of the second layer UL may include performing a sputtering process under a second partial pressure of oxygen (O2). The second partial pressure of oxygen may be greater than the first partial pressure of oxygen. Therefore, the second layer UL may have an oxygen concentration greater than that of the first layer LL (see FIG. 3). For example, the formation of the first layer LL and the formation of the second layer UL may be successively and sequentially performed in the same chamber.

Referring to FIGS. 6 and 7A to 7C, an upper portion of the first semiconductor layer 110 may be patterned to form active patterns ACT. Each of the active patterns ACT may extend in a third direction D3 parallel to a top surface of the substrate 100. The active patterns ACT may be spaced apart from each other in the third direction D3.

Each of the active patterns ACT may include a first segment LP formed when the first layer LL is patterned and a second segment UP formed when the second layer UL is patterned. The second segment UP may be formed on the first segment LP. The second segment UP may have an oxygen concentration greater than that of the first segment LP.

First and second trenches TR1 and TR2 may be defined between the active patterns ACT. The first trench TR1 may be defined between a pair of active patterns ACT adjacent to each other in a second direction D2. The second trench TR2 may be defined between a pair of active patterns ACT adjacent to each other in the third direction D3.

Referring to FIGS. 8 and 9A to 9C, a device isolation layer ST may be formed to fill the first and second trenches TR1 and TR2. The device isolation layer ST may be formed to completely fill the first and second trenches TR1 and TR2 and to cover the active patterns ACT. A planarization process may be performed on the device isolation layer ST until top surfaces of the active patterns ACT are exposed.

The active patterns ACT and the device isolation layer ST may be patterned to form third trenches TR3. When viewed in plan, each of the third trenches TR3 may have a linear shape extending in the second direction D2.

The formation of the third trenches TR3 may include forming a hardmask pattern having openings and then performing an etching process in which the hardmask pattern is used as an etching mask to etch the exposed active patterns ACT and the device isolation layer ST. The third trench TR3 may be formed shallower than the first trench TR1.

Figure 9A:
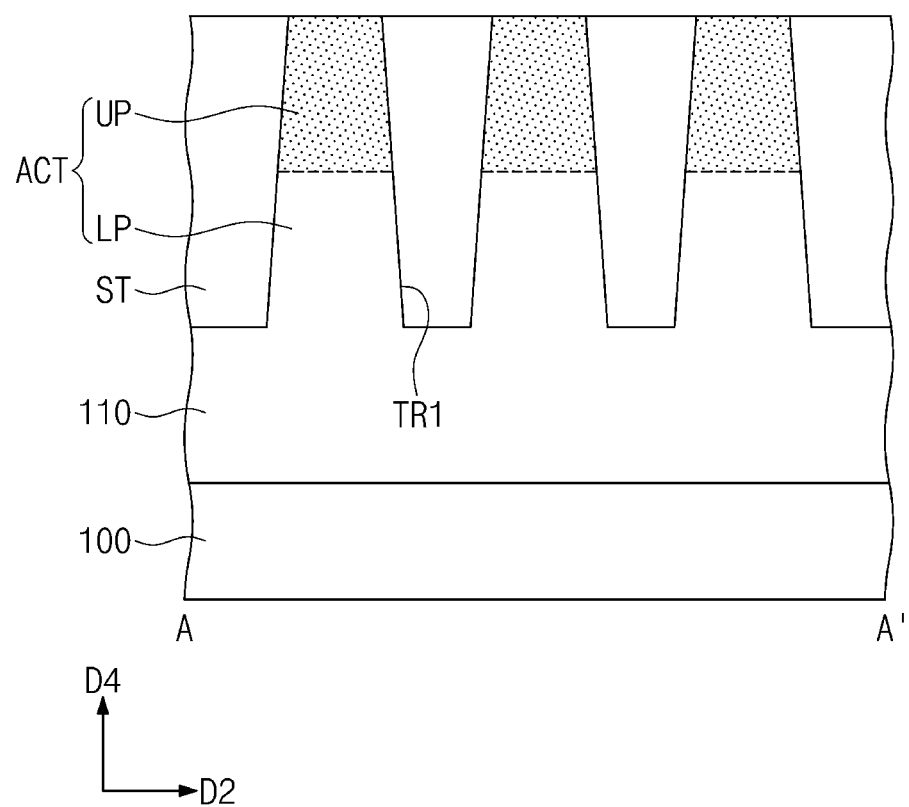
Figure 9B:
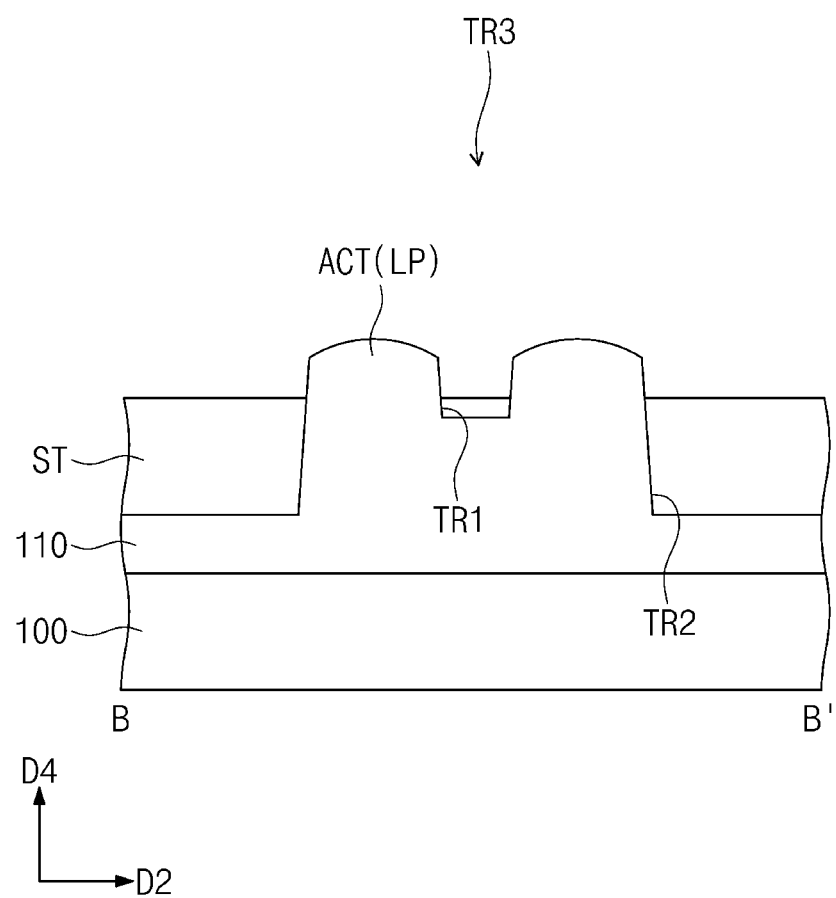
Figure 9C:
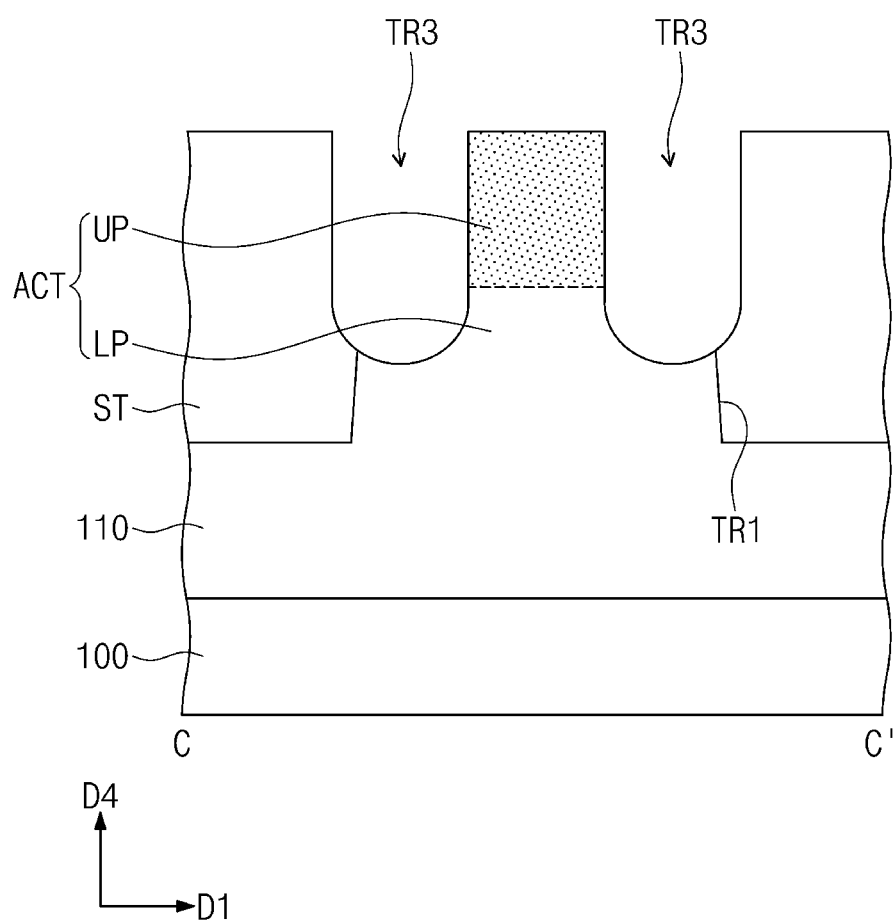
Figure 10:
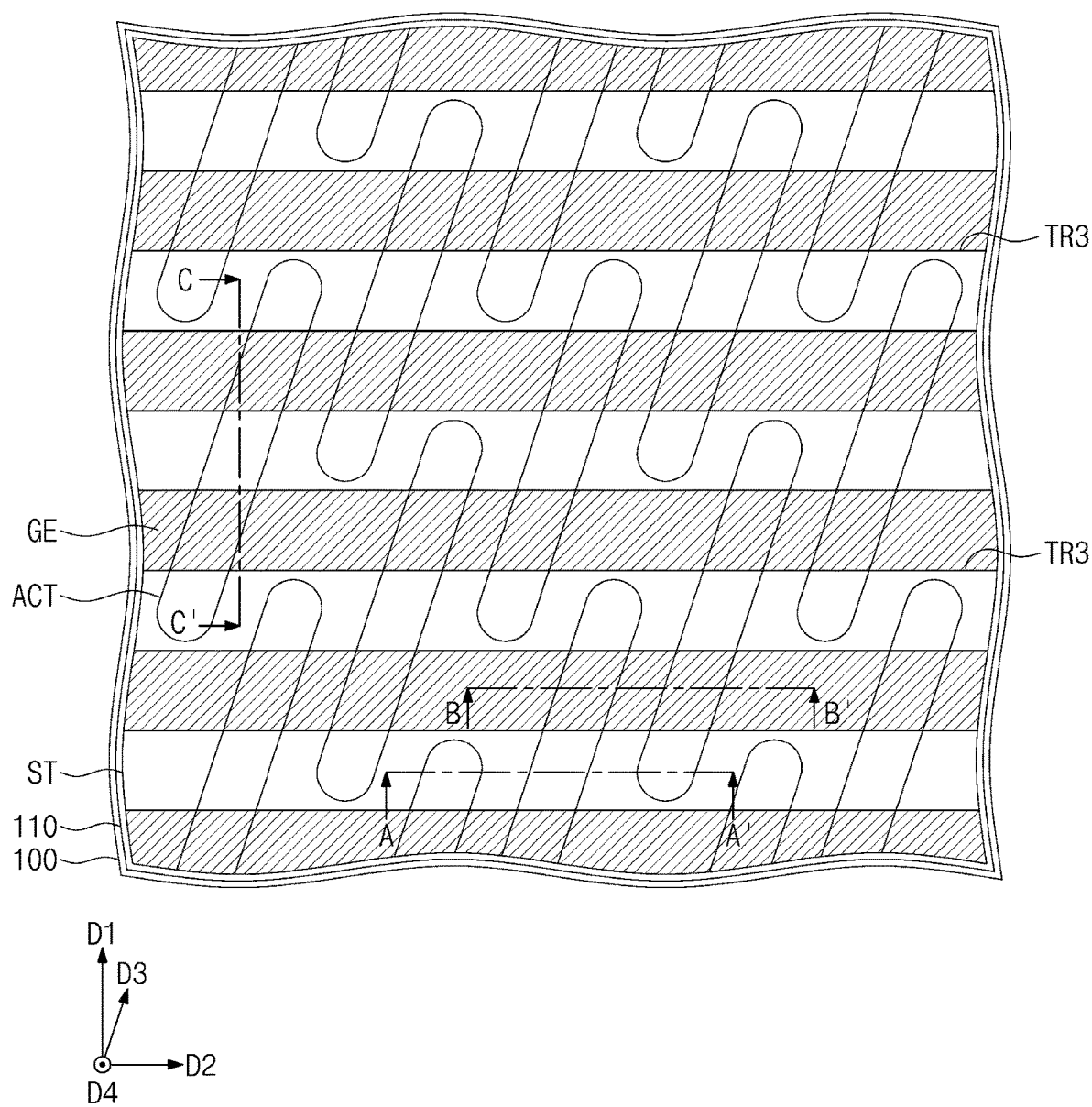
Figure 11A:
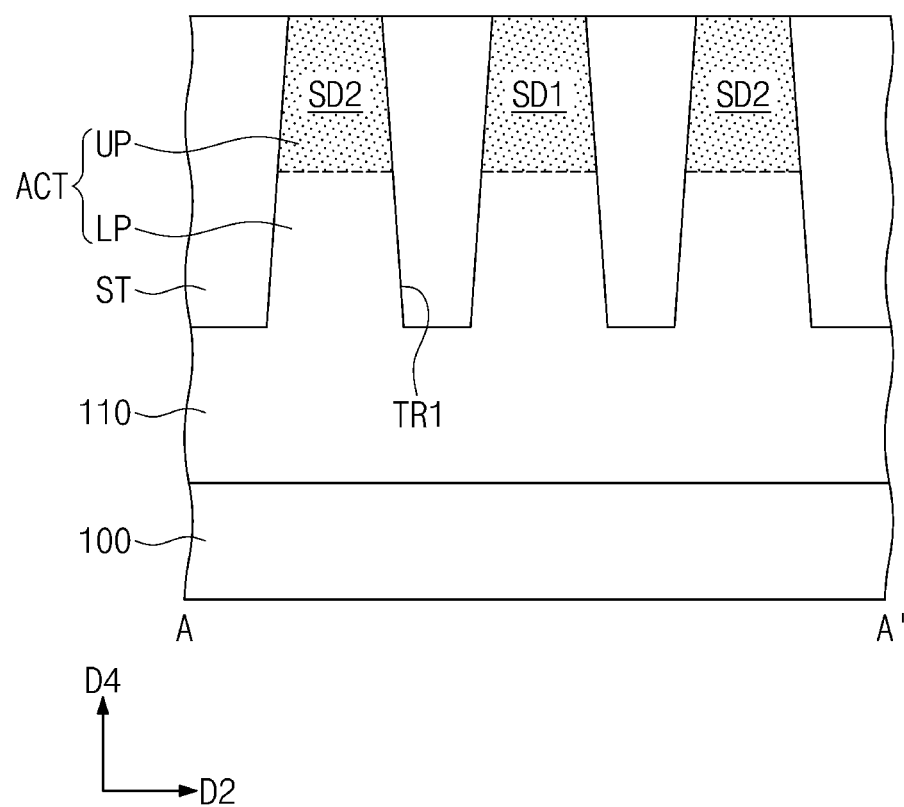
Figure 11B:
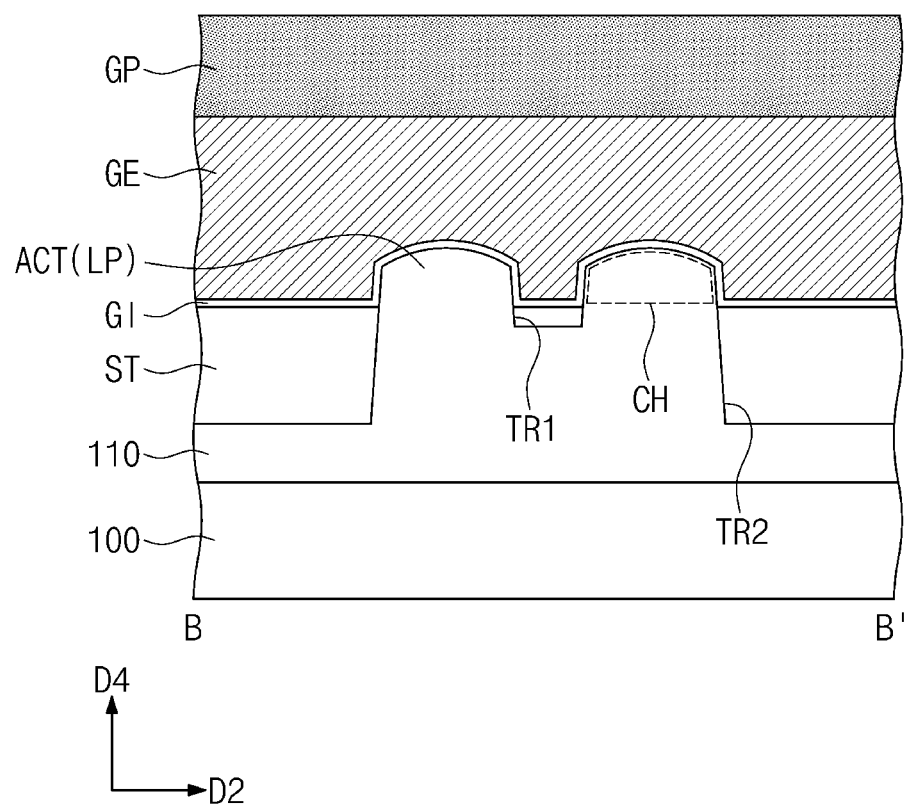
Figure 11C:
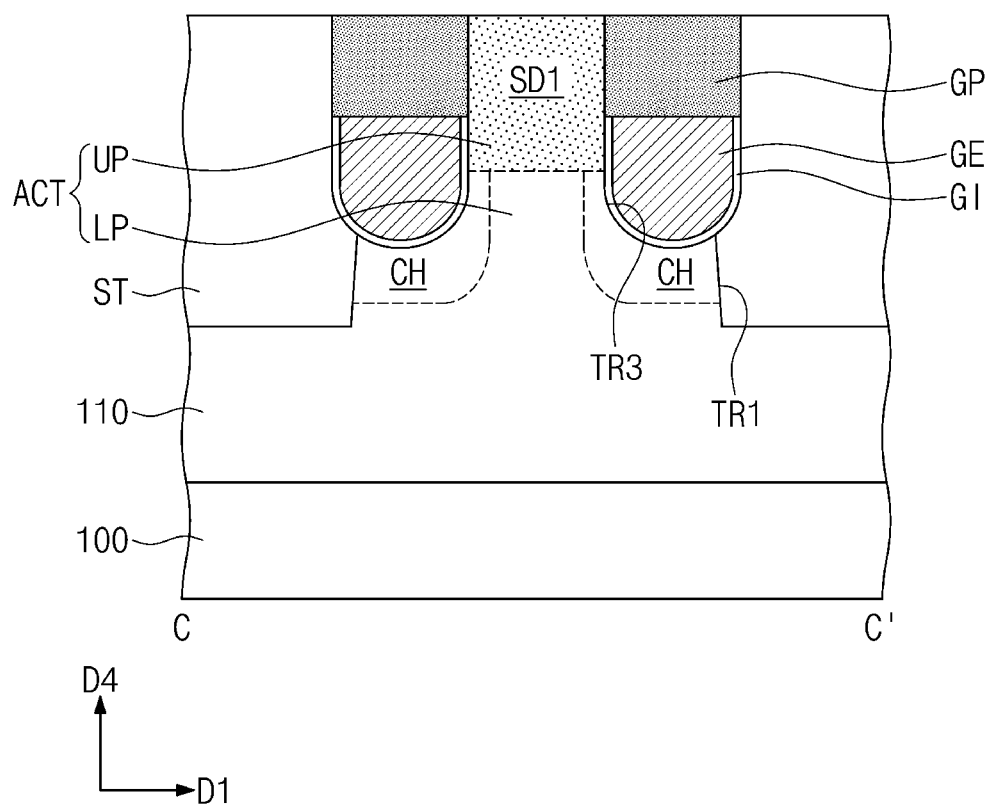
Figure 12:
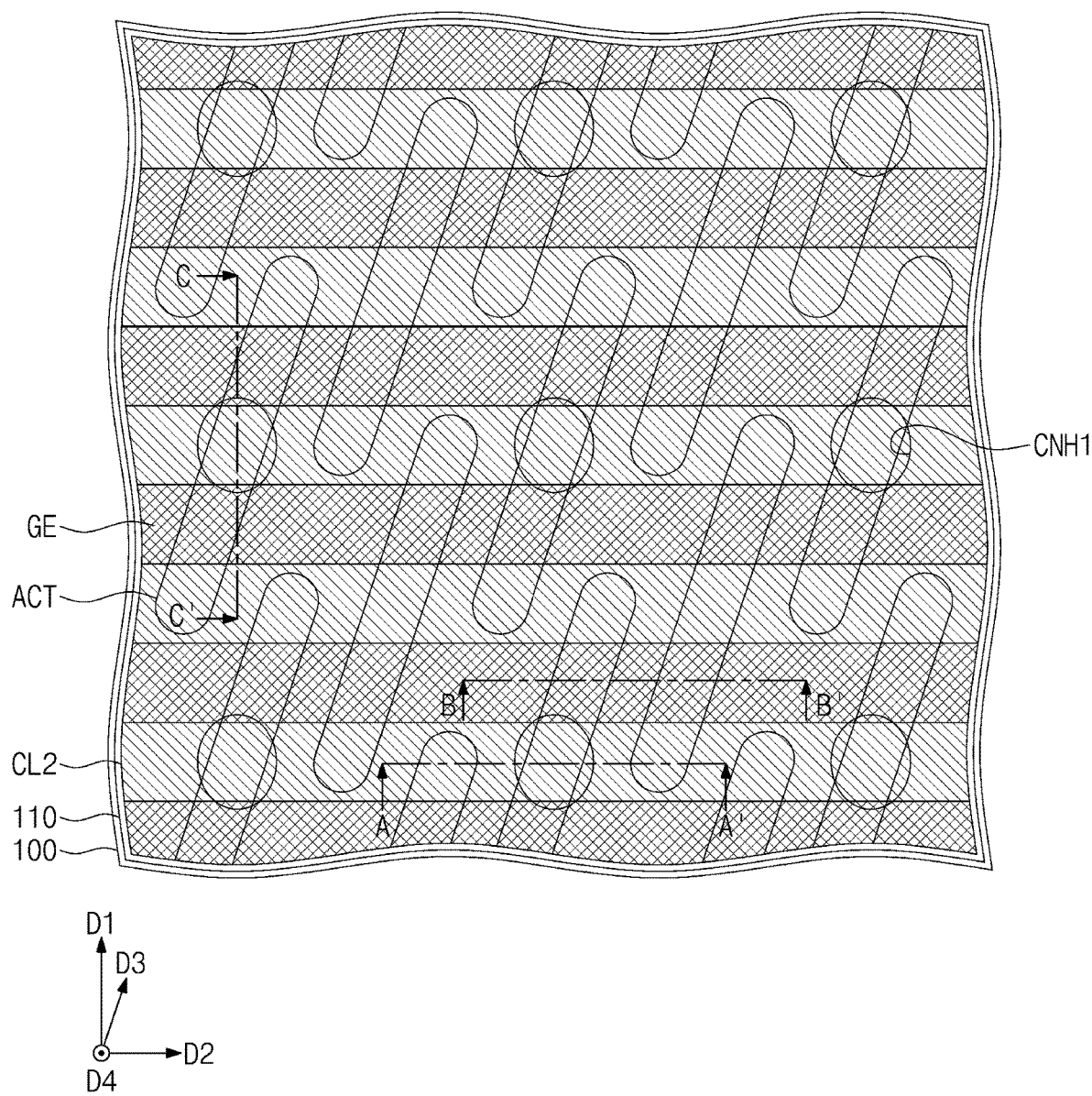
Figure 13A:
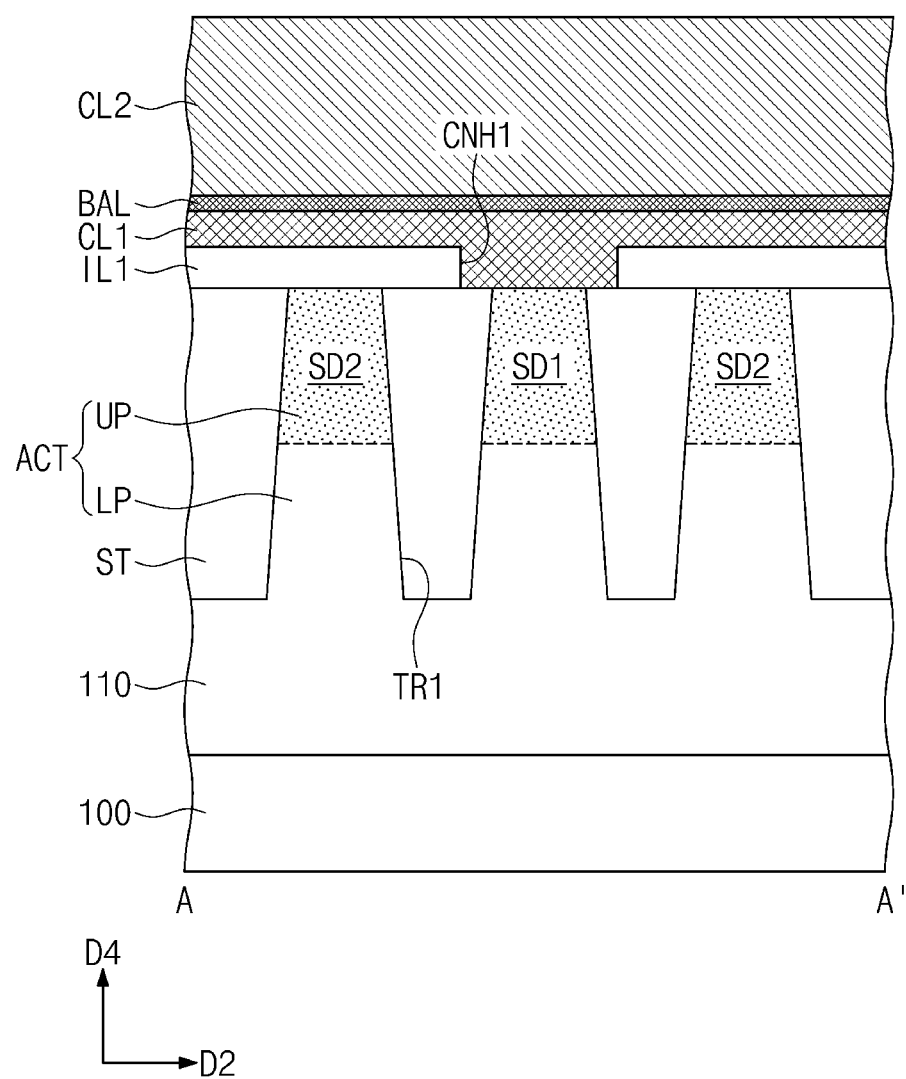
Figure 13B:
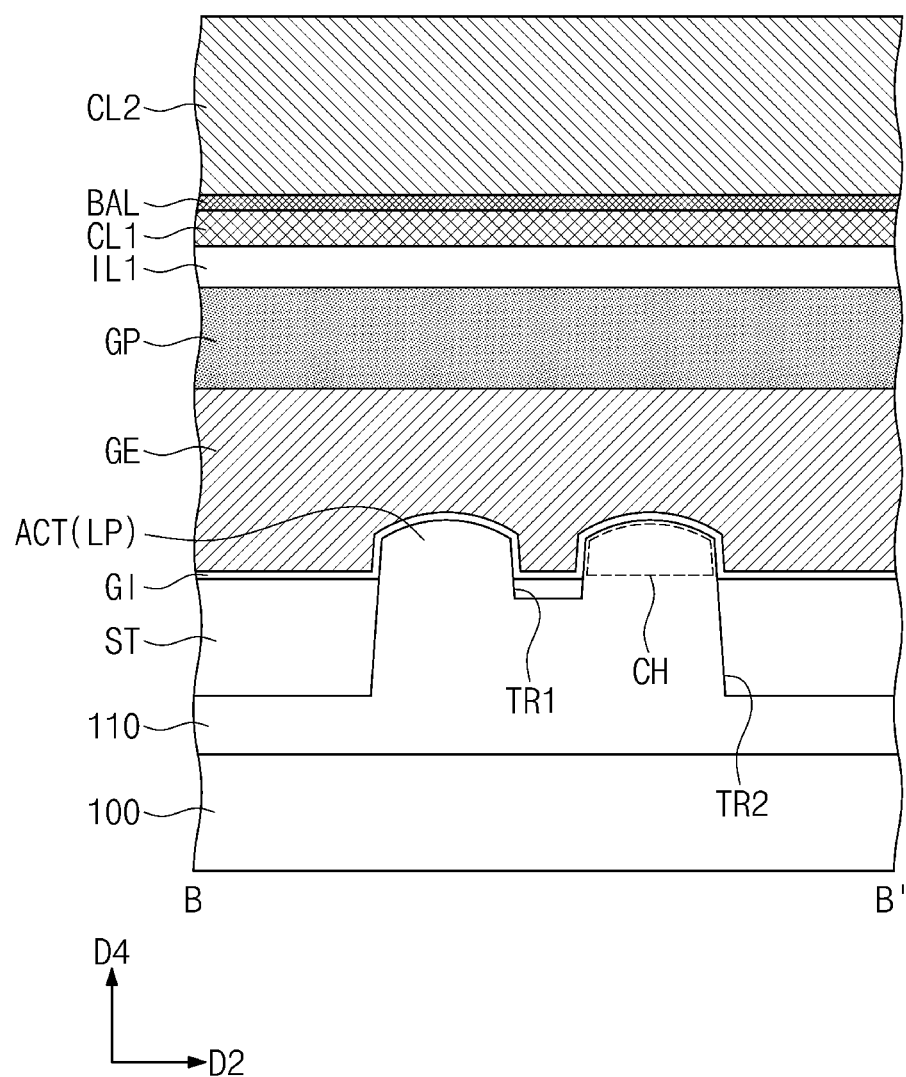
Figure 13C:
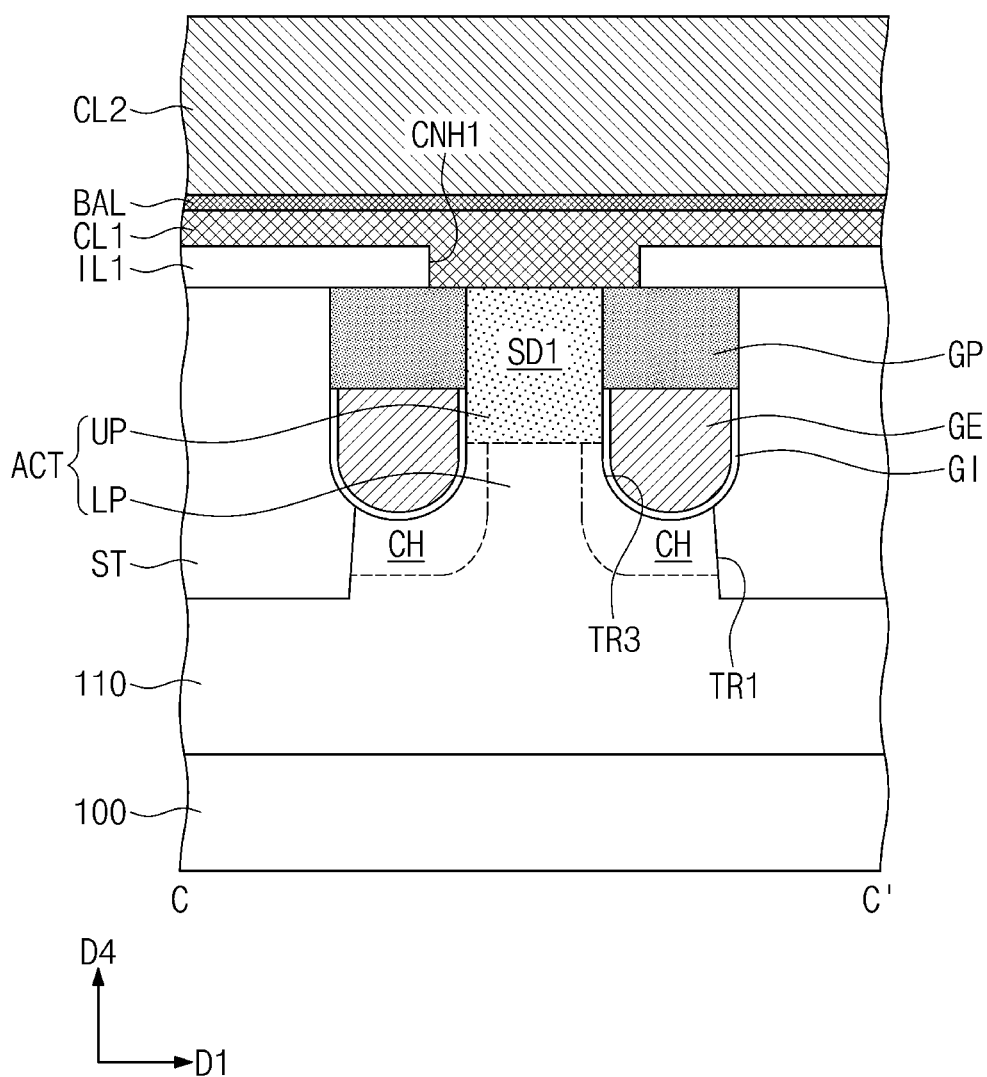
Figure 14:
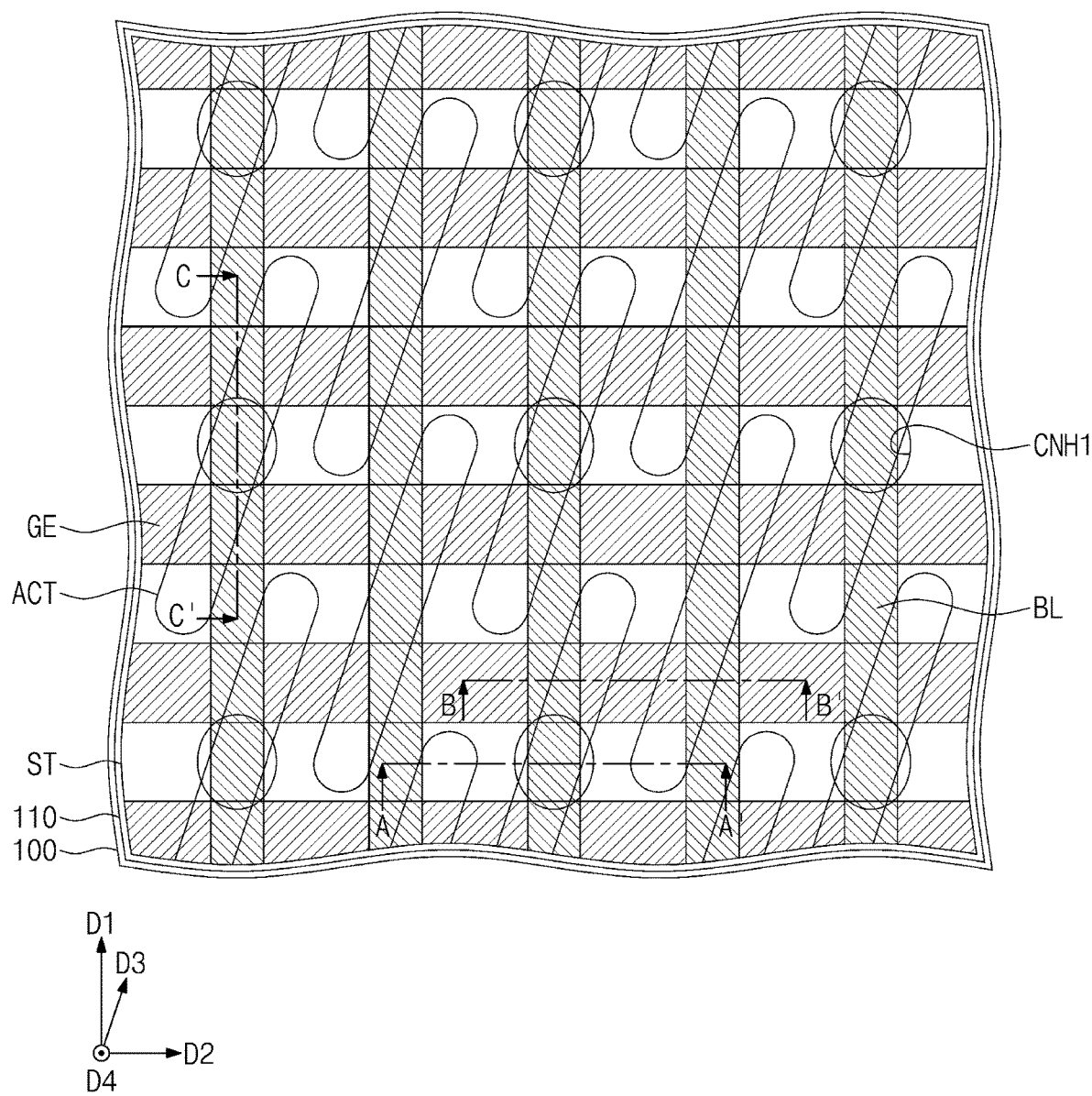
Figure 15A:
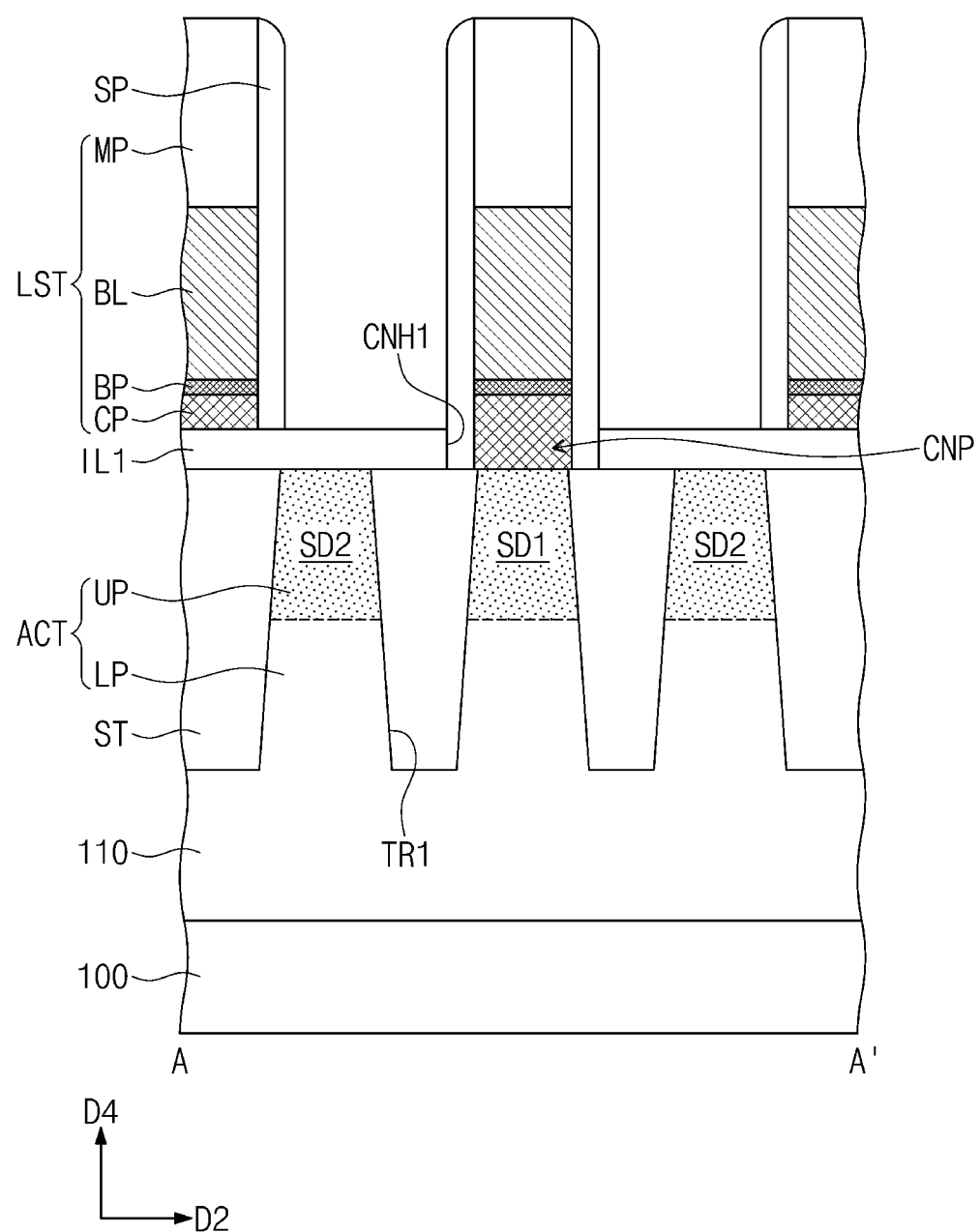
Figure 15B:
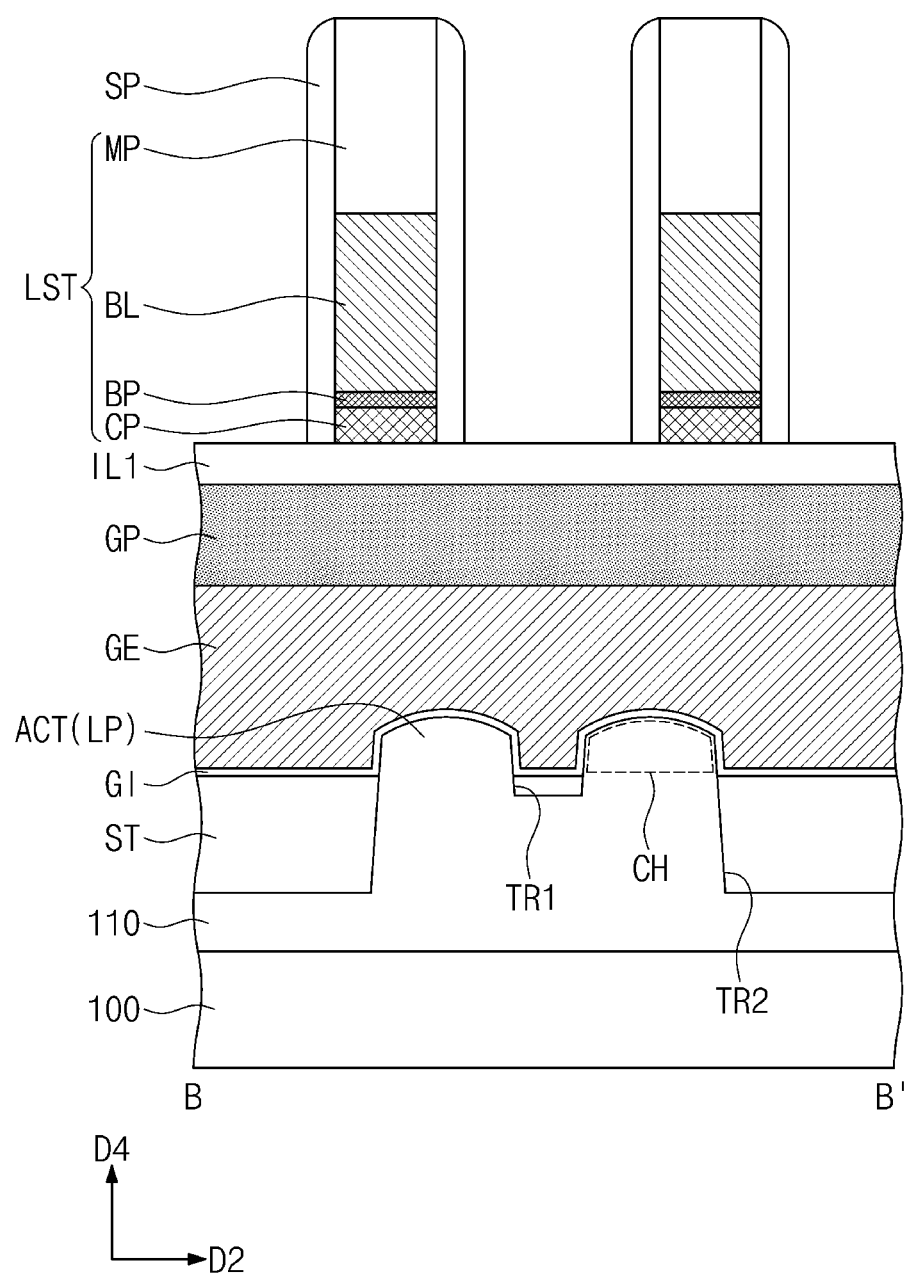
Figure 15C:
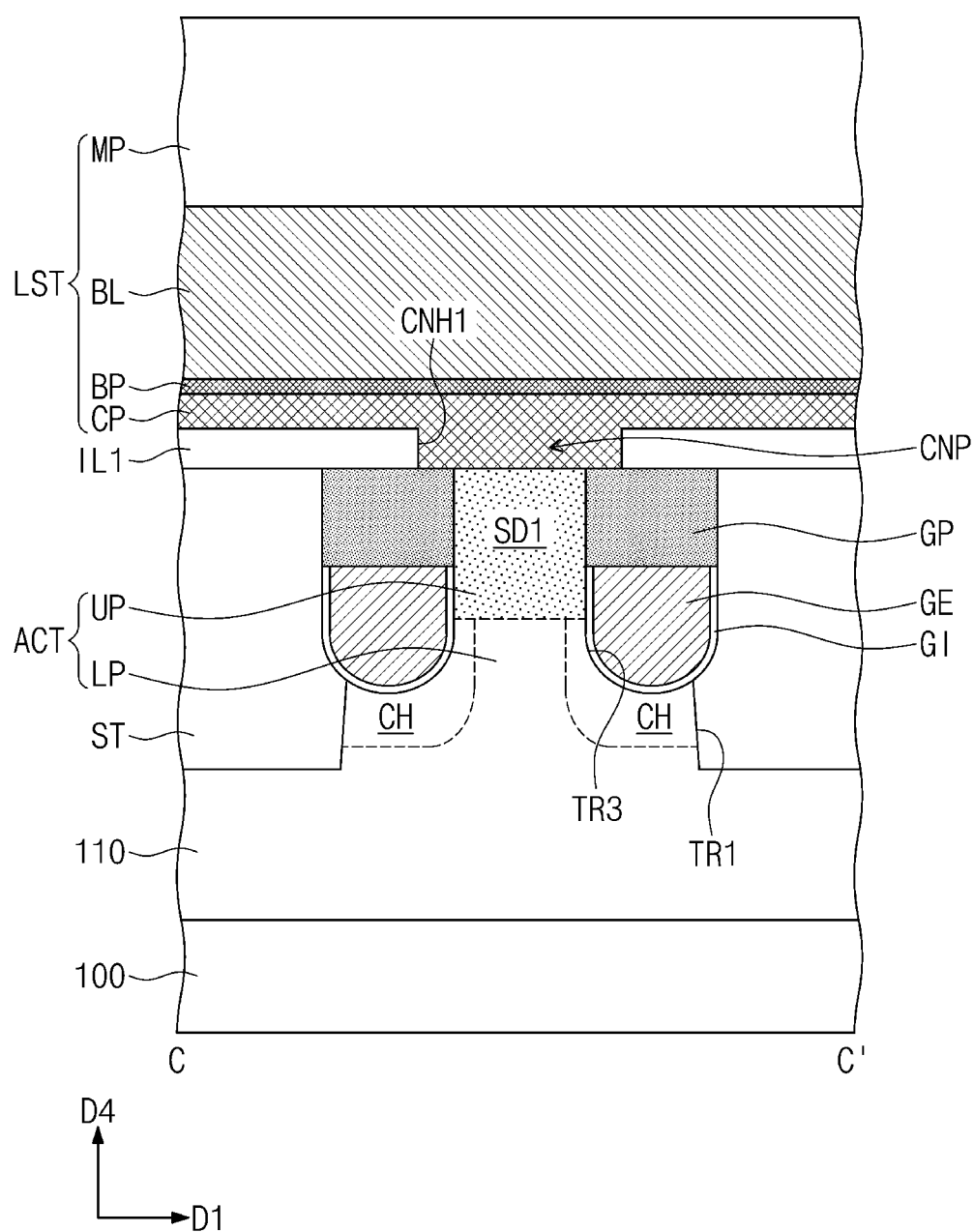

During the etching process, the device isolation layer ST may be etched more than the active patterns ACT (see FIG. 9B). The active patterns ACT in the third trench TR3 may vertically protrude beyond the device isolation layer ST. For example, the active patterns ACT in the third trench TR3 may have fin shapes.

Referring to FIGS. 10 and 11A to 11C, a gate dielectric layer GI, a gate electrode GE, and a gate capping layer GP may be formed in each of the third trenches TR3. For example, the gate dielectric layer GI may be conformally formed in each of the third trenches TR3. The gate dielectric layer GI may include one or more of a silicon oxide layer, a silicon nitride layer, a silicon oxynitride layer, and a high-k dielectric material.

A conductive layer filling the third trenches TR3 may be formed on the gate dielectric layer GI, which may result in forming gate electrodes GE. The conductive layer may include one or more of metal and conductive metal nitride.

The gate dielectric layer GI and the gate electrode GE may be recessed, and then the gate capping layer GP may be formed on the recessed gate electrode GE. The gate capping layer GP may have a top surface coplanar with that of the active pattern ACT.

A dopant implantation process may be performed to implant dopants into the active patterns ACT. The dopants may include hydrogen, indium, or a combination thereof.

A first source/drain region SD1 and a pair of second source/drain regions SD2 may be defined on an upper portion of each of the active patterns ACT. The pair of second source/drain regions SD2 may be spaced apart in the third direction D3 from each other across the first source/drain region SD1.

A channel region CH may be defined to indicate the first segment LP of the active pattern ACT, which first segment LP is positioned below the gate electrode GE. When viewed in plan, the channel region CH may be interposed between the first source/drain region SD1 and the second source/drain region SD2. The gate electrode GE may be provided on a top surface and opposite sidewalls of the channel region CH.

Referring to FIGS. 12 and 13A to 13C, a first interlayer dielectric layer IL1 may be formed on an entire surface of the substrate 100. For example, the first interlayer dielectric layer IL1 may include a silicon oxide layer. The first interlayer dielectric layer IL1 may be patterned to form first contact holes CNH1 exposing the first source/drain regions SD1 of the active patterns ACT.

A first conductive layer CL1, a barrier layer BAL, and a second conductive layer CL2 may be sequentially formed on the first interlayer dielectric layer IL1. The first conductive layer CL1 may fill the first contact holes CNH1. For example, the first conductive layer CL1 may contact the first source/drain regions SD1 of the active patterns ACT. The first interlayer dielectric layer IL1 may vertically separate the first conductive layer CL1 from the second source/drain regions SD2 of the active patterns ACT. The first conductive layer CL1 may include one of a doped semiconductor material, a metallic material, and a metal-semiconductor compound.

The barrier layer BAL may be formed to lie between the first conductive layer CL1 and the second conductive layer CL2. The barrier layer BAL may include conductive metal nitride. The second conductive layer CL2 may include a metallic material. The barrier layer BAL may prevent a metallic material in the second conductive layer CL2 from diffusing toward the first conductive layer CL1.

Referring back to FIGS. 14 and 15A to 15C, line structures LST may be formed to extend in a first direction D1 on the first interlayer dielectric layer IL1. The line structures LST may be spaced apart from each other in the second direction D2.

For example, mask patterns MP may be formed on the second conductive layer CL2. The mask patterns MP may be formed to have linear shapes extending in the first direction D1. For example, the mask patterns MP may include silicon nitride layers or silicon oxynitride layers.

The mask patterns MP may be used as an etching mask to sequentially etch the second conductive layer CL2, the barrier layer BAL, and the first conductive layer CL1 to respectively form a bit line BL, a barrier pattern BP, and a conductive pattern CP. The mask pattern MP, the bit line BL, the barrier pattern BP, and the conductive pattern CP may vertically overlap each other. The mask pattern MP, the bit line BL, the barrier pattern BP, and the conductive pattern CP may constitute the line structure LST. When viewed in plan, the bit lines BL may extend while intersecting the gate electrodes GE.

The conductive pattern CP may include contact parts CNP filling the first contact holes CNH1. The conductive pattern CP may be connected through the contact part CNP to the first source/drain region SD1. For example, the bit line BL may be electrically connected through the conductive pattern CP to the first source/drain region SD1.

A pair of spacers SP may be formed on opposite sidewalls of each of the line structures LST. The formation of the spacers SP may include conformally forming a spacer layer on the entire surface of the substrate 100 and anisotropically etching the spacer layer.

Referring back to FIGS. 1 and 2A to 2C, a second interlayer dielectric layer IL2 may be formed on the substrate 100. For example, the second interlayer dielectric layer IL2 may include a silicon oxide layer. A planarization process may be performed on the second interlayer dielectric layer IL2 until top surfaces of the mask patterns MP are exposed.

The second and first interlayer dielectric layers IL2 and IL1 may experience a patterning process to form second contact holes CNH2 exposing the second source/drain regions SD2 of the active patterns ACT. Since the mask patterns MP and the spacers SP are used as an etching mask during the patterning process, the second contact holes CNH2 may be formed in a self-alignment manner.

The second contact holes CNH2 may be filled with a conductive material to form contacts CNT. The contacts CNT may be connected to the second source/drain regions SD2. A data storage element DS may be formed on each of the contacts CNT. For example, the data storage element DS may be a capacitor.

Figure 16:
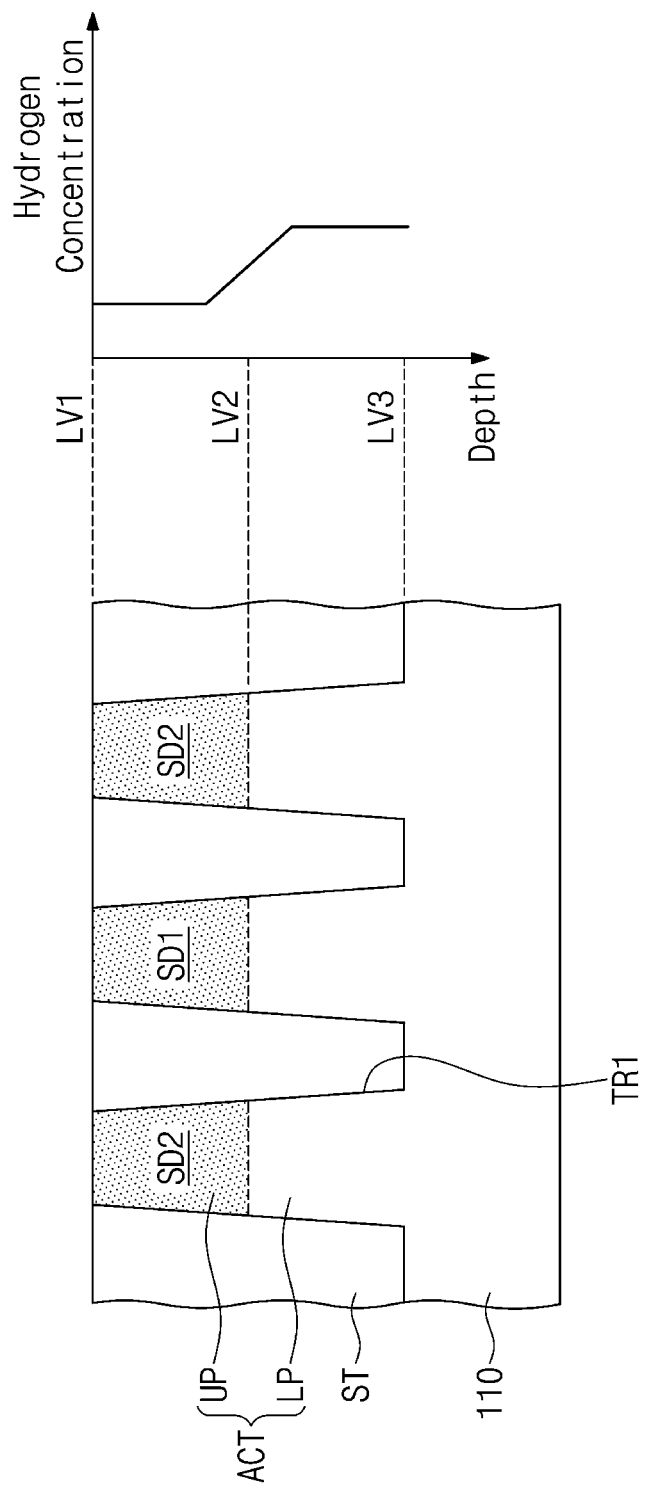
FIG. 16 illustrates a graph showing a hydrogen concentration versus a depth of an active pattern, according to exemplary embodiments of inventive concepts.

FIG. 16 illustrates a graph showing a hydrogen concentration versus a depth of an active pattern, according to exemplary embodiments of inventive concepts. In the embodiment that follows, a detailed description of technical features repetitive to those of the semiconductor device discussed above with reference to FIGS. 1, 2A to 2C, and 3 will be omitted, and a difference thereof will be discussed in detail.

Referring to FIGS. 1, 2A to 2C, 3, and 16, the active pattern ACT may include hydrogen as a dopant. The active pattern ACT may have a dopant concentration (or a hydrogen concentration) that increases from the first level LV1 toward the third level LV3. The hydrogen concentration may rapidly increase at the second level LV2.

A threshold voltage of the amorphous oxide semiconductor constituting the active pattern ACT may be reduced with an increase in hydrogen concentration of the amorphous oxide semiconductor. In contrast, the threshold voltage of the amorphous oxide semiconductor may be increased with a decrease in hydrogen concentration of the amorphous oxide semiconductor. For example, the dopant concentration (or the hydrogen concentration) may be adjusted to control the threshold voltage of the amorphous oxide semiconductor.

According to some exemplary embodiments of inventive concepts, the second segment UP of the active pattern ACT may have a relatively low hydrogen concentration. When a threshold voltage is raised due to a decrease in hydrogen concentration, a current leakage may be reduced. In consequence, a current leakage may be prevented at the second segment UP adjacent to the upper portion of the gate electrode GE.

Figure 17A:
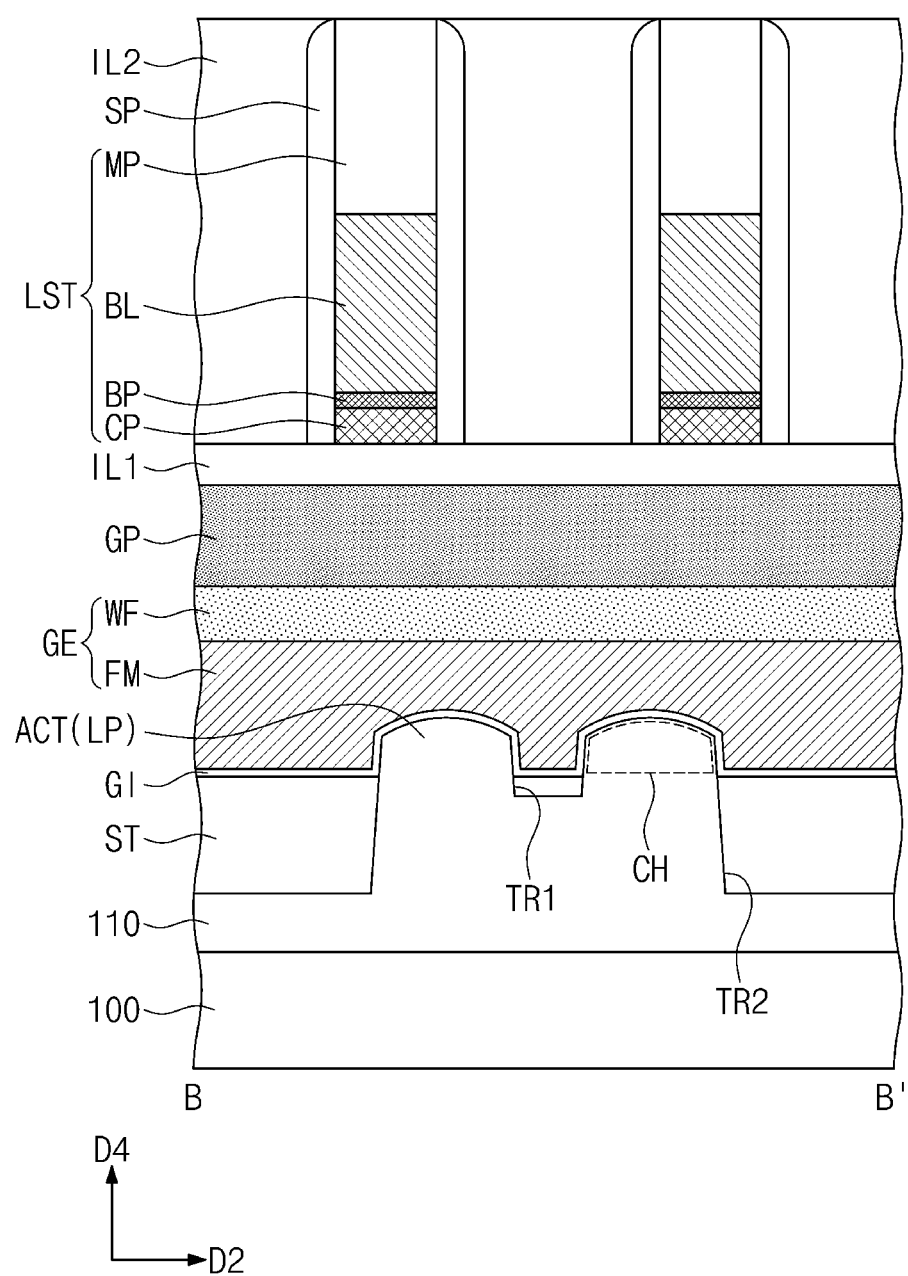
FIGS. 17A and 17B illustrate cross-sectional views respectively taken along lines B-B' and C-C' of FIG. 1, showing a semiconductor device according to exemplary embodiments of inventive concepts.
Figure 17B:
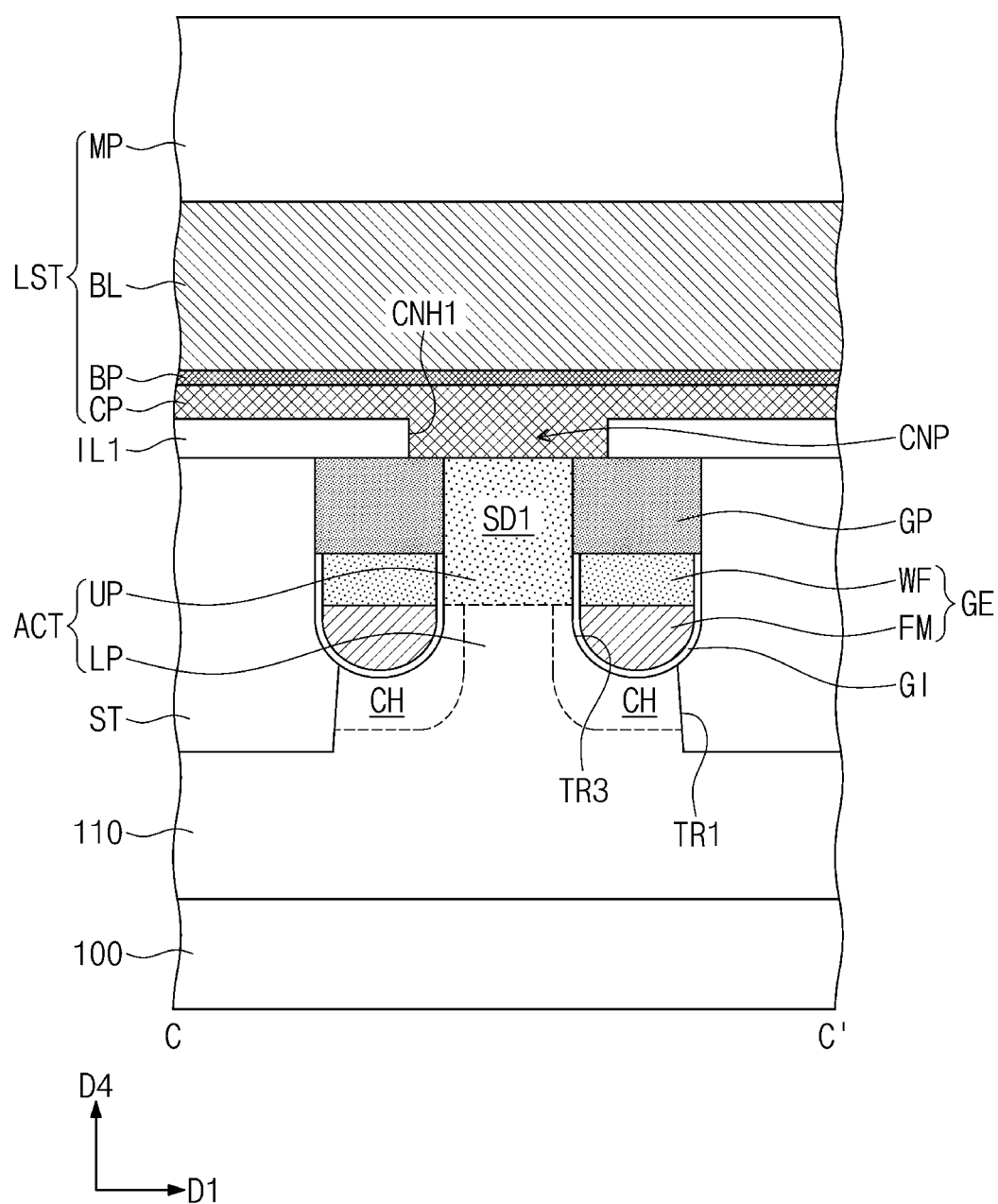

FIGS. 17A and 17B illustrate cross-sectional views respectively taken along lines B-B' and C-C' of FIG. 1, showing a semiconductor device according to exemplary embodiments of inventive concepts. In the embodiment that follows, a detailed description of technical features repetitive to those of the semiconductor device discussed above with reference to FIGS. 1, 2A to 2C, and 3 will be omitted, and a difference thereof will be discussed in detail.

Referring to FIGS. 1, 2A, 17A, and 17B, each of the gate electrodes GE may include a first electrode FM and a second electrode WF on the first electrode FM. The first electrode FM may be adjacent to the first segment LP of the active pattern ACT. The second electrode WF may be adjacent to the second segment UP of the active pattern ACT.

The second electrode WF may include a material whose work function is different from that of the first electrode FM. The first electrode FM may include a metallic material (e.g., titanium, tantalum, tungsten, or copper). The second electrode WF may include a doped semiconductor material (e.g., doped n-type polysilicon) or a metallic material (e.g., aluminum).

According to some exemplary embodiments of inventive concepts, the stacking of the second electrode WF on the first electrode FM may increase a threshold voltage of the second segment UP adjacent to the second electrode WF. In consequence, a current leakage may be prevented at the second segment UP adjacent to the second electrode WF.

Figure 18:
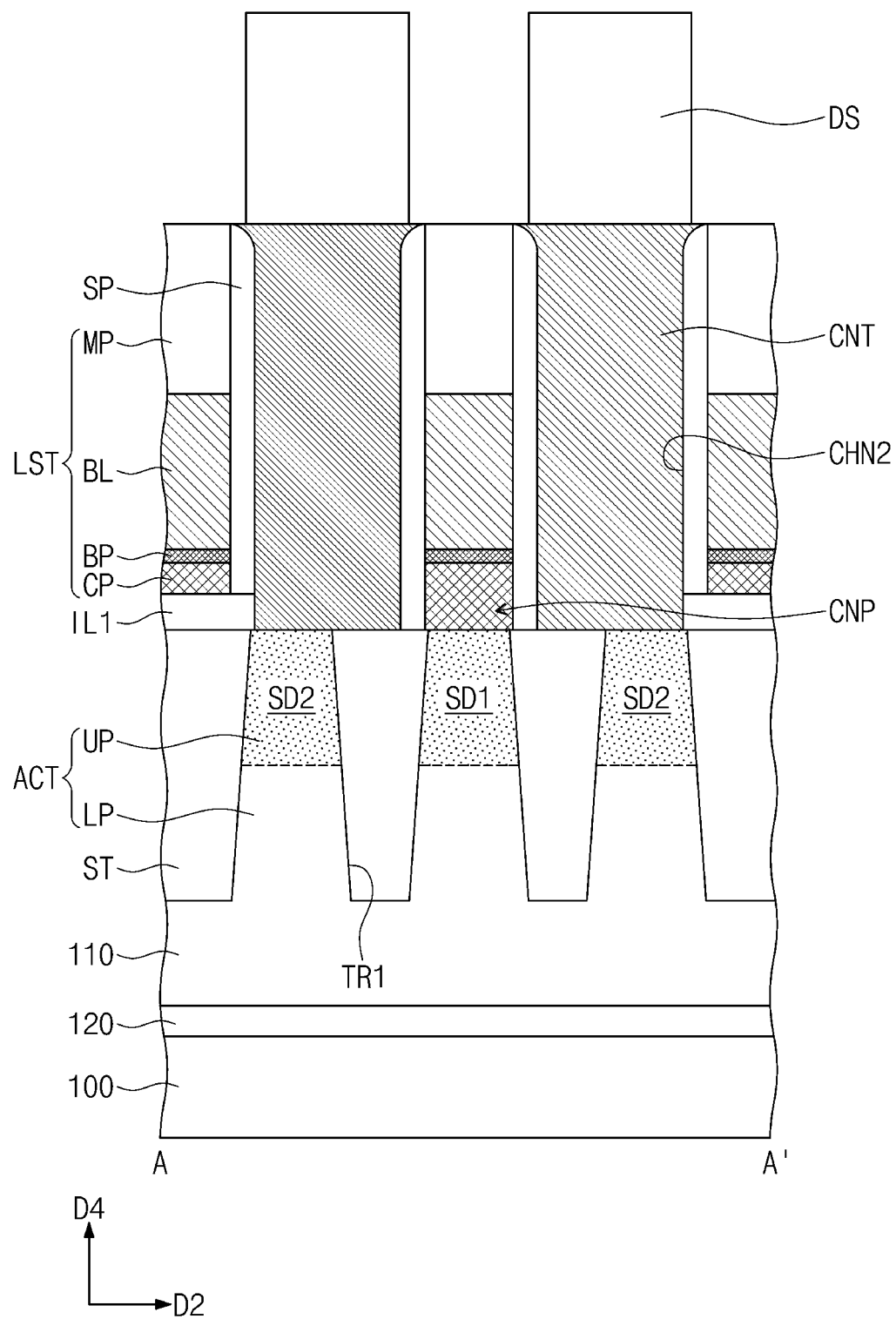
FIGS. 18 and 19 illustrate cross-sectional views taken along line A-A' of FIG. 1, showing a semiconductor device according to exemplary embodiments of inventive concepts.
Figure 19:
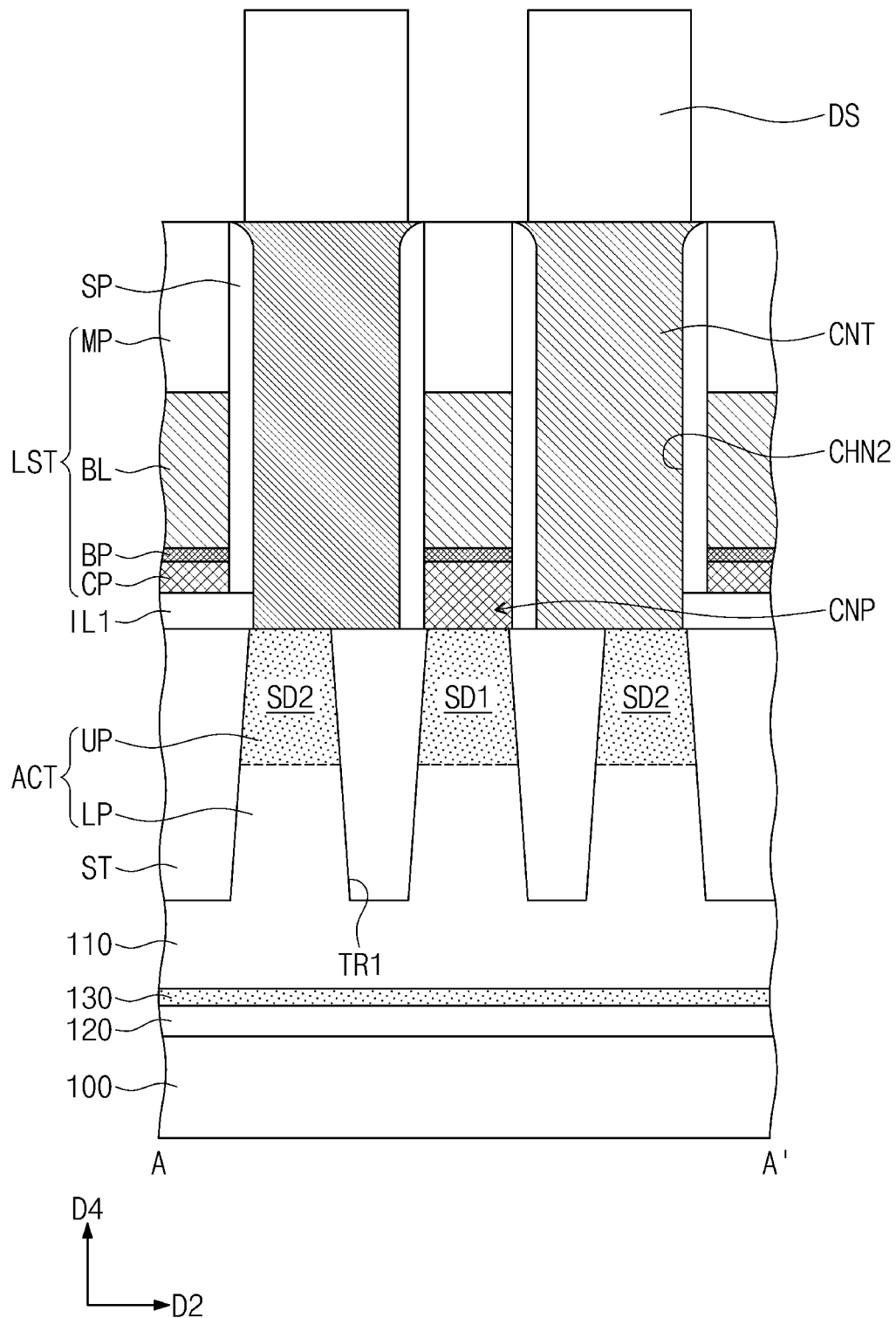

FIGS. 18 and 19 illustrate cross-sectional views taken along line A-A' of FIG. 1, showing a semiconductor device according to exemplary embodiments of inventive concepts. In the embodiment that follows, a detailed description of technical features repetitive to those of the semiconductor device discussed above with reference to FIGS. 1, 2A to 2C, and 3 will be omitted, and a difference thereof will be discussed in detail.

Referring to FIGS. 1 and 18, an insulation layer 120 may be interposed between the substrate 100 and the first semiconductor layer 110. For example, the first semiconductor layer 110 may be formed on the insulation layer 120. The insulation layer 120 may include a silicon oxide layer.

Referring to FIGS. 1 and 19, an insulation layer 120 and a seed layer 130 may be interposed between the substrate 100 and the first semiconductor layer 110. For example, the first semiconductor layer 110 may be grown from the seed layer 130 on the insulation layer 120.

Figure 20A:
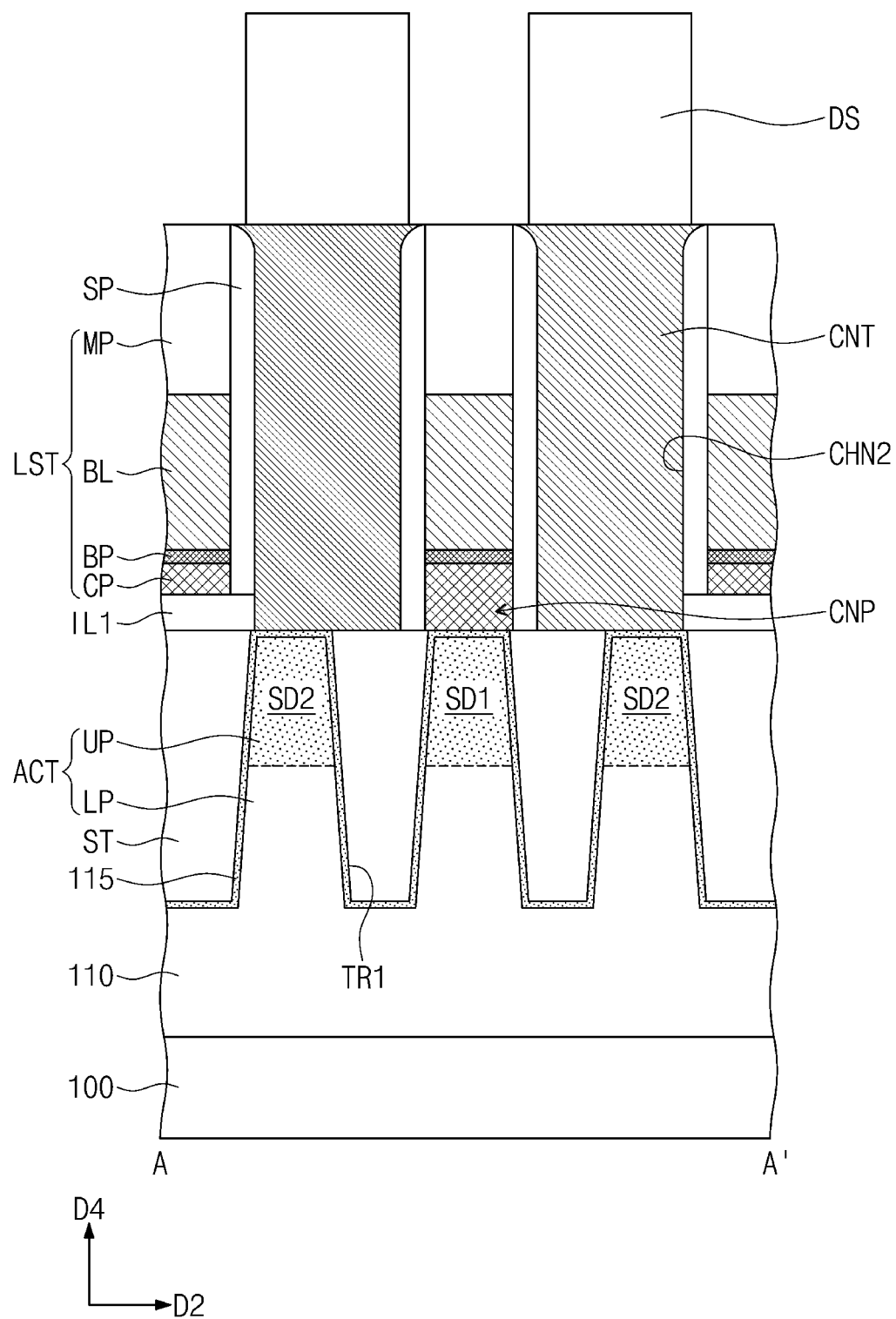
FIGS. 20A, 20B, and 20C illustrate cross-sectional views respectively taken along lines A-A', B-B', and C-C' of FIG. 1, showing a semiconductor device according to exemplary embodiments of inventive concepts.
Figure 20B:
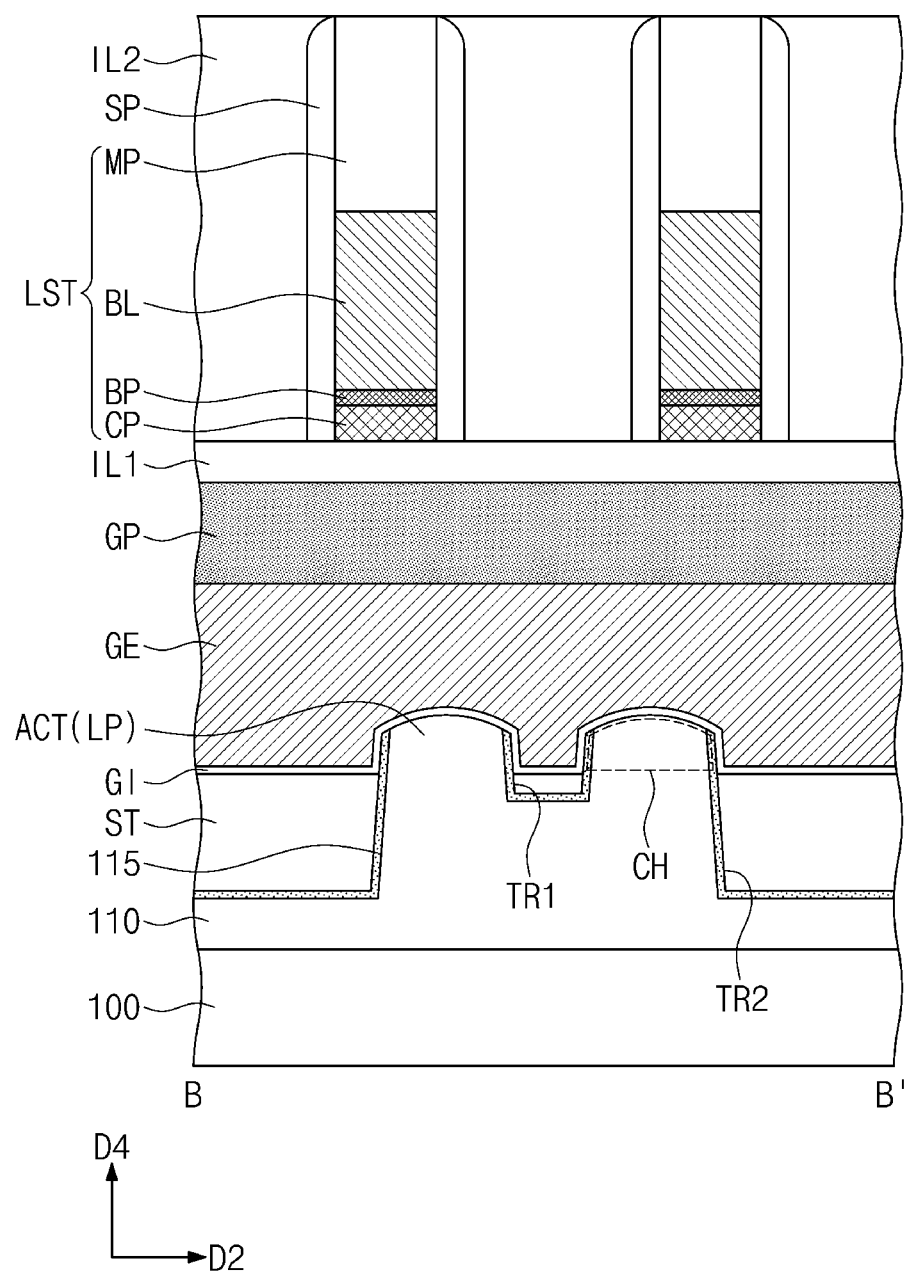
Figure 20C:
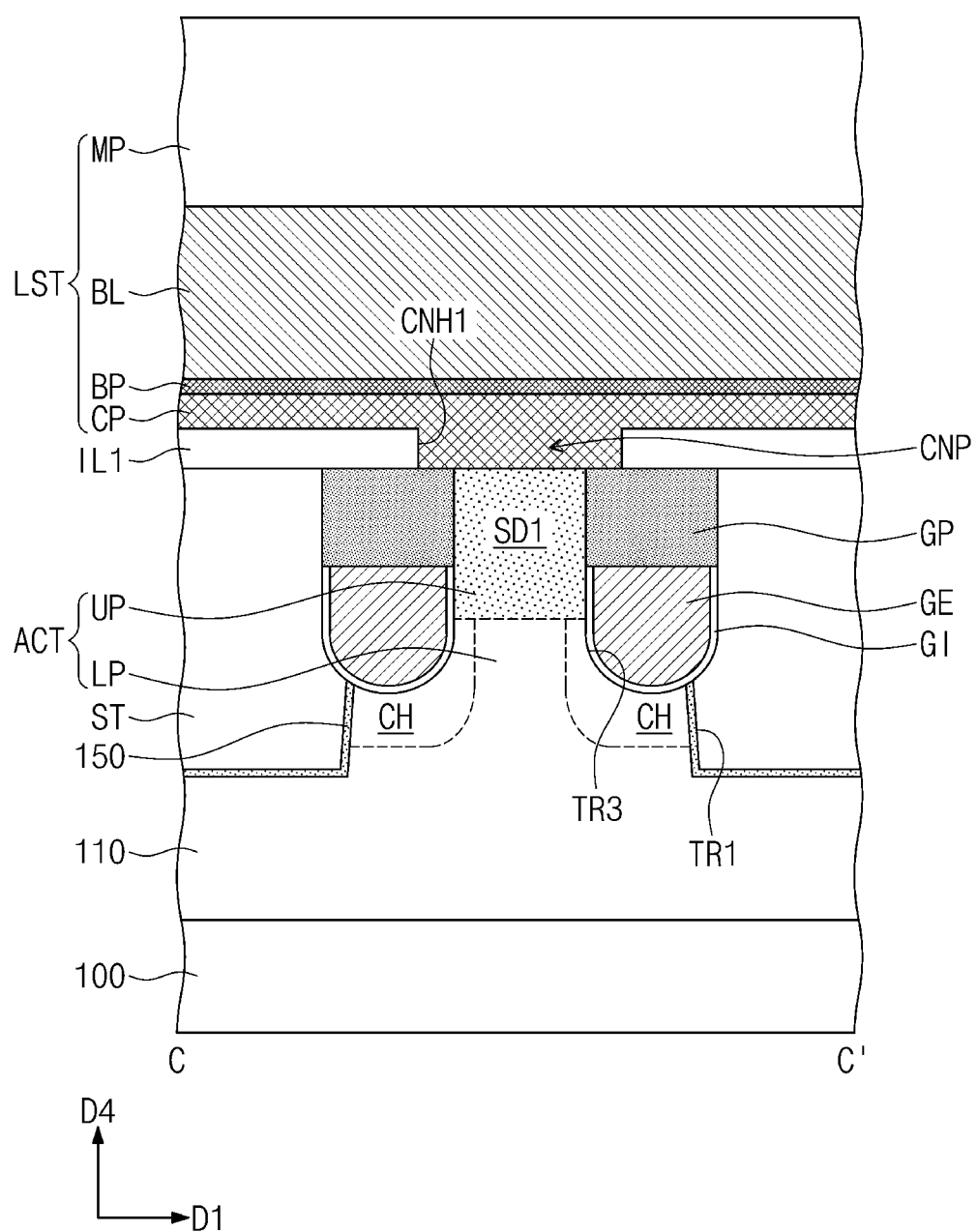

FIGS. 20A, 20B, and 20C illustrate cross-sectional views respectively taken along lines A-A', B-B', and C-C' of FIG. 1, showing a semiconductor device according to exemplary embodiments of inventive concepts. In the embodiment that follows, a detailed description of technical features repetitive to those of the semiconductor device discussed above with reference to FIGS. 1, 2A to 2C, and 3 will be omitted, and a difference thereof will be discussed in detail.

Referring to FIGS. 1 and 20A to 20C, a second semiconductor layer 115 may be provided on the first semiconductor layer 110. The second semiconductor layer 115 may cover a surface of each of the active patterns ACT. The second semiconductor layer 115 may be interposed between the device isolation layer ST and the active patterns ACT.

The second semiconductor layer 115 may have a threshold voltage greater than that of the first semiconductor layer 110. Since the second semiconductor layer 115 covers the active pattern ACT, a current leakage may be prevented at the active pattern ACT.

For example, the second semiconductor layer 115 may include an amorphous oxide semiconductor identical to that of the first semiconductor layer 110. The second semiconductor layer 115 may have an oxygen concentration greater than that of the first semiconductor layer 110. For example, the oxygen concentration of the second semiconductor layer 115 may be greater than that of the first segment LP. The oxygen concentration of the second semiconductor layer 115 may be greater than that of the second segment UP. The second semiconductor layer 115 may have a hydrogen concentration less than that of the first semiconductor layer 110.

For another example, the second semiconductor layer 115 may include an amorphous oxide semiconductor different from that of the first semiconductor layer 110. The first semiconductor layer 110 may include indium-gallium-zinc oxide (IGZO), and the second semiconductor layer 115 may include indium-tin-zinc oxide (ITZO). For another example, the second semiconductor layer 115 may include silicon (Si) or silicon carbide (SiC).

Figure 21:
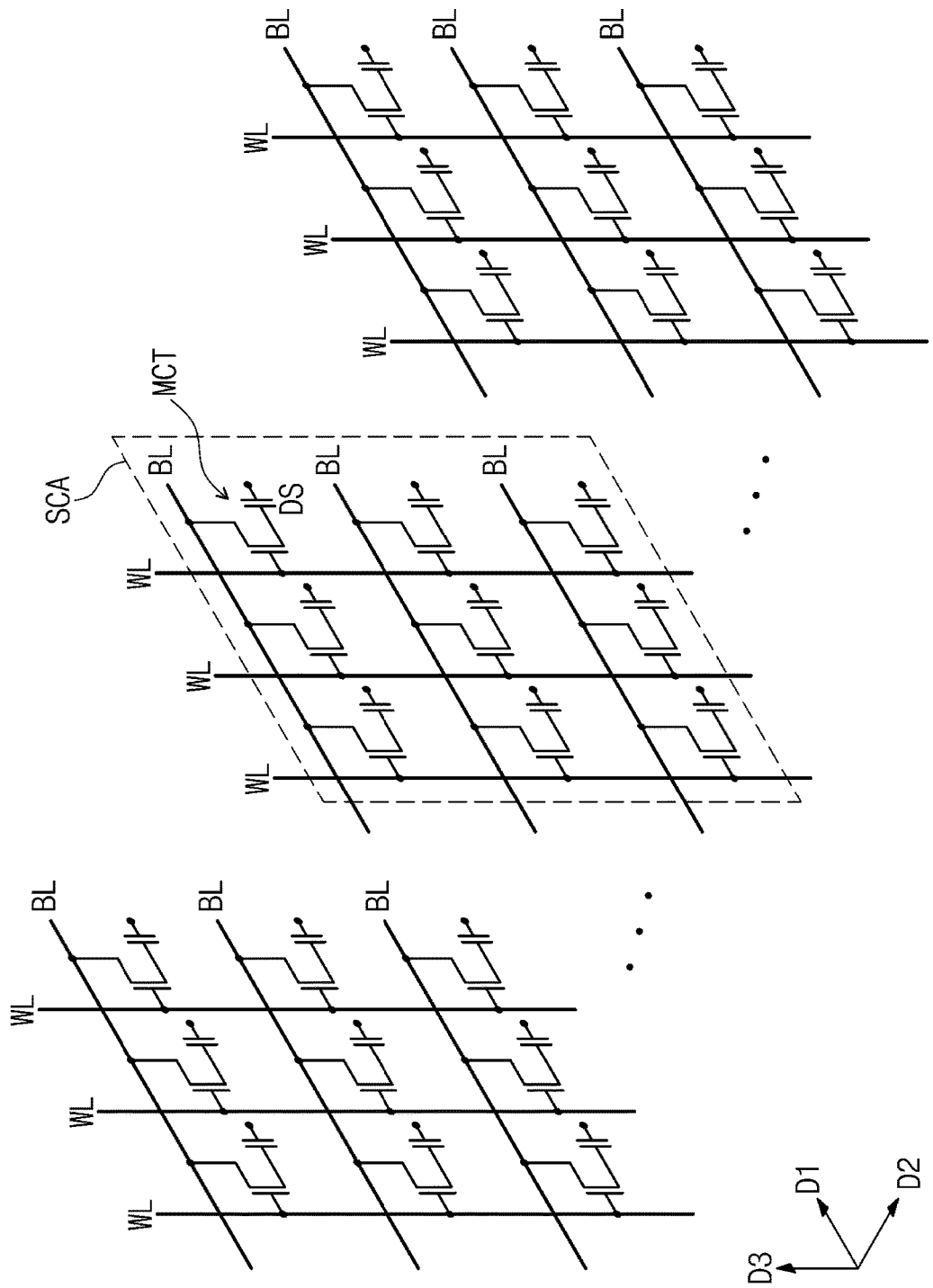
FIG. 21 illustrates a simplified circuit diagram showing a cell array of a three-dimensional semiconductor memory device according to exemplary embodiments of inventive concepts.

FIG. 21 illustrates a simplified circuit diagram showing a cell array of a three-dimensional semiconductor memory device according to exemplary embodiments of inventive concepts.

Referring to FIG. 21, a three-dimensional semiconductor memory device according to some exemplary embodiments of inventive concepts may include a cell array consisting of a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metal lines) that are spaced apart from and disposed on a substrate. The bit lines BL may extend in a first direction D1. The bit lines BL in one sub-cell array SCA may be spaced apart from each other in a vertical direction (i.e., a third direction D3).

The word lines WL may be conductive patterns (e.g., metal lines) that extend in a vertical direction (i.e., the third direction D3) to the substrate. The word lines WL in one sub-cell array SCA may be spaced apart from each other in the first direction D1.

A gate of the memory cell transistor MCT may be connected to the word line WL, and a source of the memory cell transistor MCT may be connected to the bit line BL. Each of the memory cell transistors MCT may include a data storage element DS. For example, the data storage element DS may be a capacitor, and a drain of the memory cell transistor MCT may be connected to the capacitor.

Figure 22:
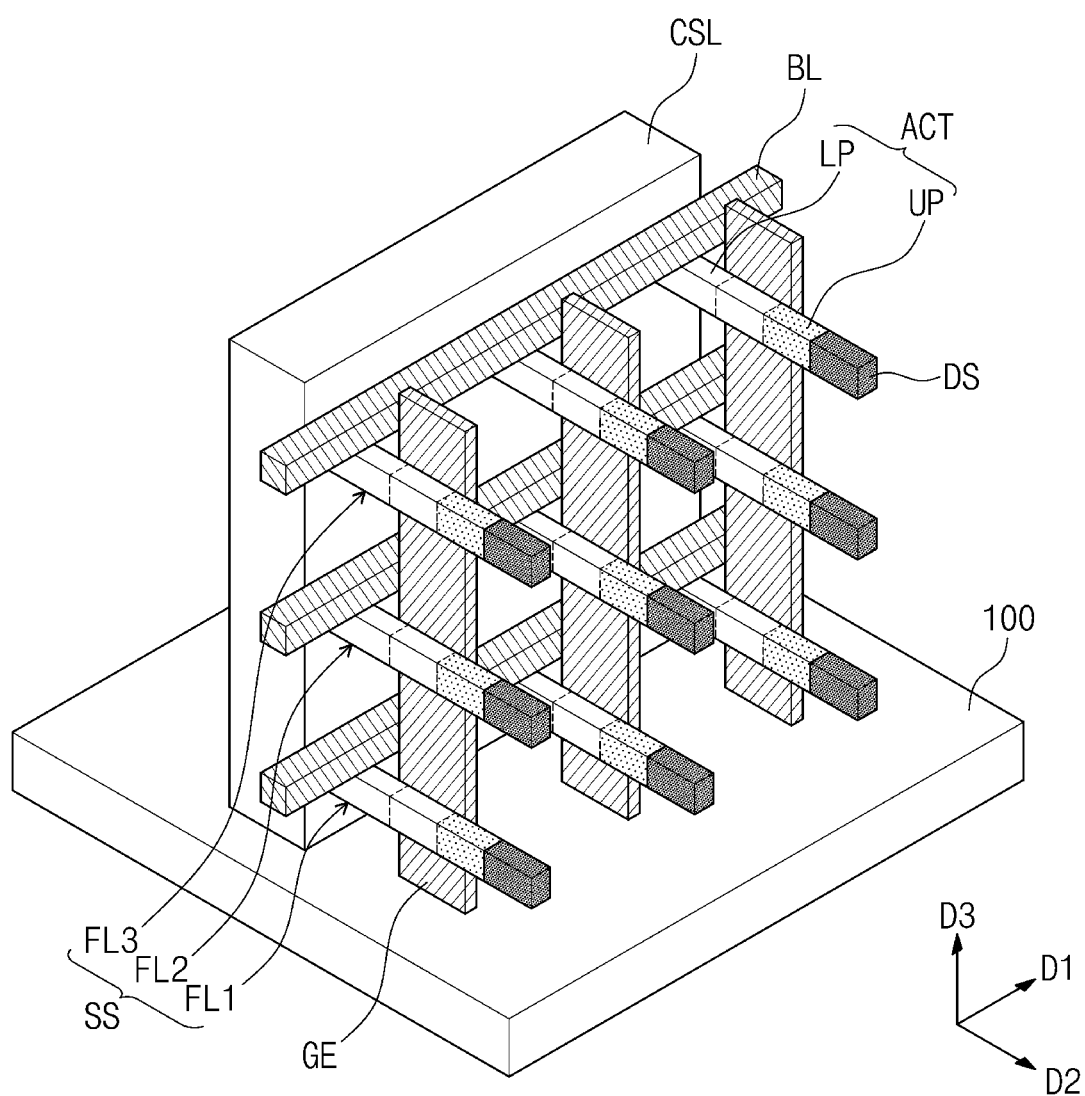
FIG. 22 illustrates a perspective view showing a three-dimensional semiconductor memory device according to exemplary embodiments of inventive concepts.
Figure 23:
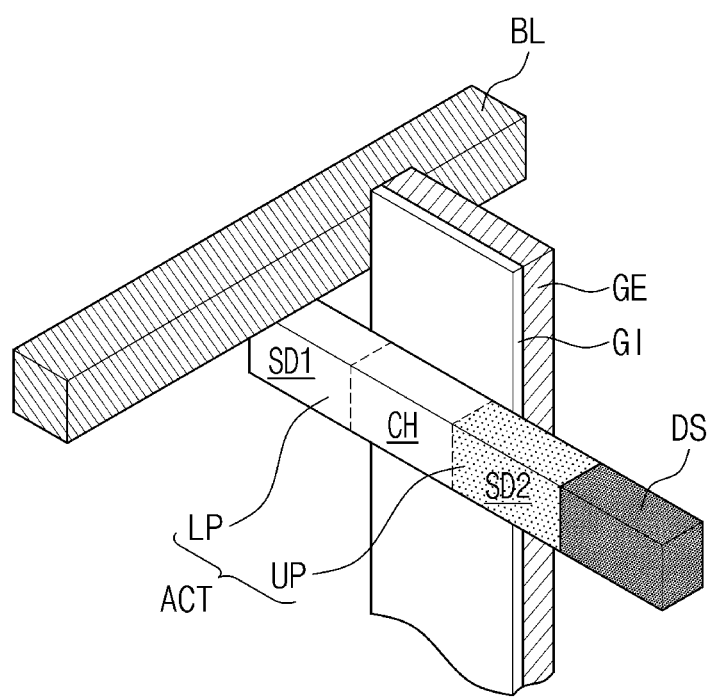
FIG. 23 illustrates an enlarged perspective view showing a unit cell of the three-dimensional semiconductor memory device of FIG. 22.
Figure 23:
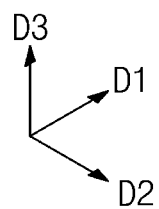

FIG. 22 illustrates a perspective view showing a three-dimensional semiconductor memory device according to exemplary embodiments of inventive concepts. FIG. 23 illustrates an enlarged perspective view showing a unit cell of the three-dimensional semiconductor memory device of FIG. 22.

Referring to FIGS. 21, 22, and 23, a substrate 100 may be provided thereon with one of the plurality of sub-cell arrays SCA discussed with reference to FIG. 21. For example, the substrate 100 may be provided thereon with a stack structure SS including first, second, and third layers FL1, FL2, and FL3. The first, second, and third layers FL1, FL2, and FL3 of the stack structure SS may be stacked in a vertical direction (i.e., a third direction D3). Each of the first, second, and third layers FL1, FL2, and FL3 may include a plurality of active patterns ACT, a plurality of data storage elements DS, and a bit line BL.

The active patterns ACT may be arranged in a first direction D1. The active patterns ACT may have linear, bar, or pillar shapes extending in a second direction D2. Each of the active patterns ACT may include an amorphous oxide semiconductor. For example, each of the active patterns ACT may include indium-gallium-zinc oxide (IGZO) or indium-tin-zinc oxide (ITZO).

Each of the active patterns ACT may include a first segment LP and a second segment UP. The first segment LP and the second segment UP may be adjacent to each other in the second direction D2. For example, the second segment UP may extend in the second direction D2 from the first segment LP.

The first segment LP may have an oxygen concentration less than that of the second segment UP. A detailed description of this may be substantially the same as that of the first segment LP and the second segment UP of the active pattern ACT discussed above with reference to FIG. 3.

Each of the active patterns ACT may include a channel region CH, a first source/drain region SD1, and a second source/drain region SD2. The channel region CH may be interposed between the first and second source/drain regions SD1 and SD2. The first segment LP of the active pattern ACT may include the channel region CH and the first source/drain region SD1. The second segment UP of the active pattern ACT may include the second source/drain region SD2.

The data storage element DS may be electrically connected to the second segment UP of the active pattern ACT. The data storage element DS may be electrically connected to the second source/drain region SD2 of the active pattern ACT. For example, the data storage element DS may be a capacitor.

The bit line BL may be electrically connected to the first segment LP of the active pattern ACT. The bit line BL may be electrically connected to the first source/drain region SD1 of the active pattern ACT.

According to some exemplary embodiments of inventive concepts, the second segment UP of the active pattern ACT may have a relatively high oxygen concentration. The second segment UP may have a relatively high threshold voltage. In consequence, a current leakage may be prevented at the second segment UP connected to the data storage element DS.

According to some exemplary embodiments of inventive concepts, the first segment LP of the active pattern ACT may have a relatively low oxygen concentration. The first segment LP may have a relatively low threshold voltage. As a result, a current boosting effect may occur at the channel region CH of the first segment LP. In addition, a current may smoothly flow between the first segment LP and the bit line BL.

The bit lines BL may have linear or bar shapes extending in the first direction D1. The bit lines BL may be stacked along the third direction D3. The bit lines BL may include a conductive material. For example, the conductive material may include one of doped semiconductor (doped silicon, doped germanium, etc.), conductive metal nitride (titanium nitride, tantalum nitride, etc.), metal (tungsten, titanium, tantalum, etc.), and metal-semiconductor compound (tungsten silicide, cobalt silicide, titanium silicide, etc.).

The substrate 100 may be provided thereon with gate electrodes GE penetrating the stack structure SS. The gate electrodes GE may have linear, bar, or pillar shapes extending in the third direction D3. The gate electrodes GE may be arranged in the first direction D1. When viewed in plan, each of the gate electrodes GE may be provided between a pair of active patterns ACT adjacent to each other. Each of the gate electrodes GE may vertically extend on sidewalls of a plurality of active patterns ACT that are vertically stacked. The gate electrodes GE may correspond to the word lines WL of FIG. 21.

For example, one of the gate electrodes GE may be adjacent to a first one of the active patterns ACT on the first layer FL1, a first one of the active patterns ACT on the second layer FL2, and a first one of the active patterns ACT on the third layer FL3. Another of the gate electrodes GE may be adjacent to a second one of the active patterns ACT on the first layer FL1, a second one of the active patterns ACT on the second layer FL2, and a second one of the active patterns ACT on the third layer FL3.

The gate electrode GE may be adjacent to the channel region CH of the active pattern ACT. A gate dielectric layer GI may be interposed between the gate electrode GE and the channel region CH. The gate electrodes GE may include a conductive material, which conductive material may be one of doped semiconductor, conductive metal nitride, metal, and metal-semiconductor compound. The gate dielectric layer GI may include one or more of a silicon oxide layer, a silicon nitride layer, a silicon oxynitride layer, and a high-k dielectric material.

The substrate 100 may be provided thereon with a common source line CSL extending in the first direction D1 along one lateral surface of the stack structure SS. The first segment LP of the active pattern ACT may be coupled to the common source line CSL. The common source line CSL may be connected to a body of each of the memory cell transistors MCT discussed with reference to FIG. 21. The common source line CSL may include a conductive material, which conductive material may be one of doped semiconductor, conductive metal nitride, metal, and metal-semiconductor compound.

Although not shown, an insulating material may fill empty spaces in the stack structure SS. For example, the insulating material may include one or more of a silicon oxide layer, a silicon nitride layer, and a silicon oxynitride layer.

Figure 24:
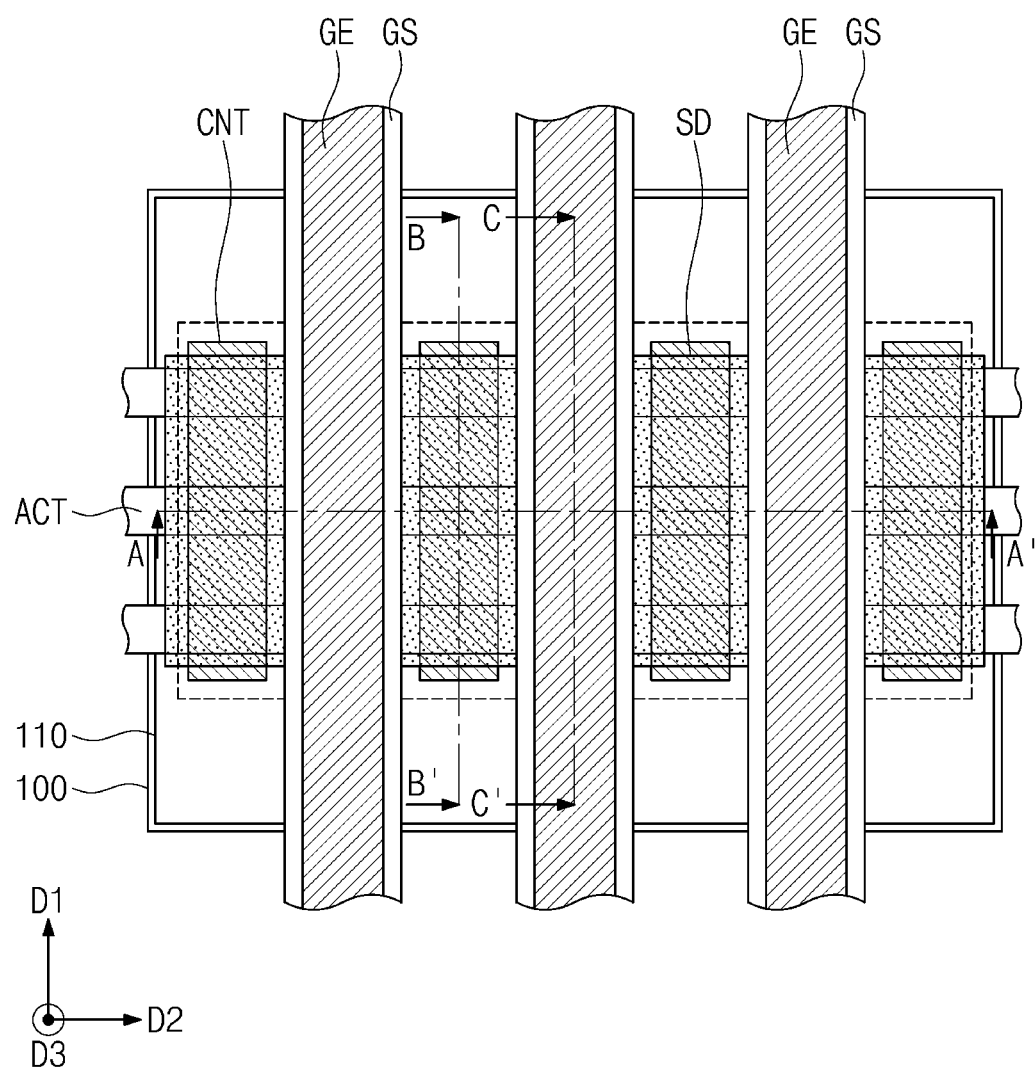
FIG. 24 illustrates a plan view showing a semiconductor device according to exemplary embodiments of inventive concepts.
Figure 25A:
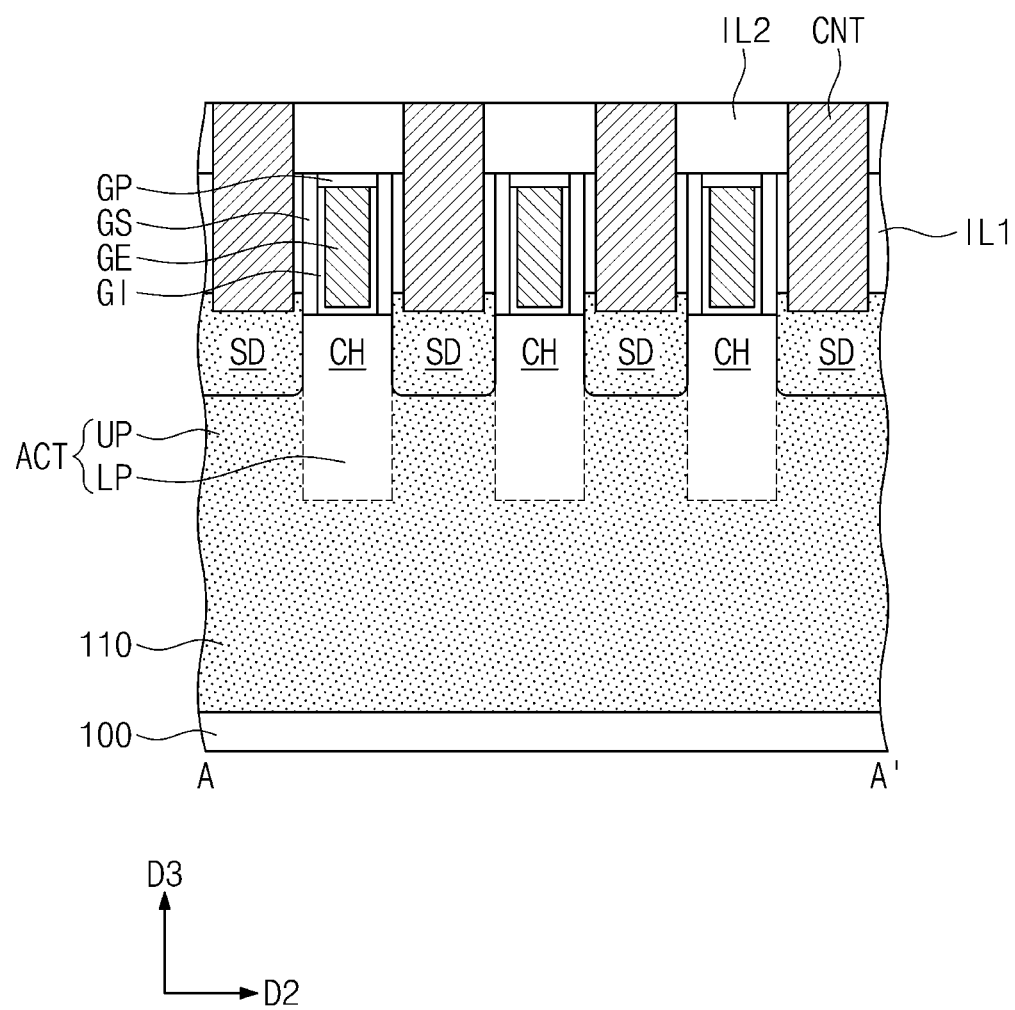
FIGS. 25A, 25B, and 25C illustrate cross-sectional views respectively taken along lines A-A', B-B', and C-C' of FIG. 24.
Figure 25B:
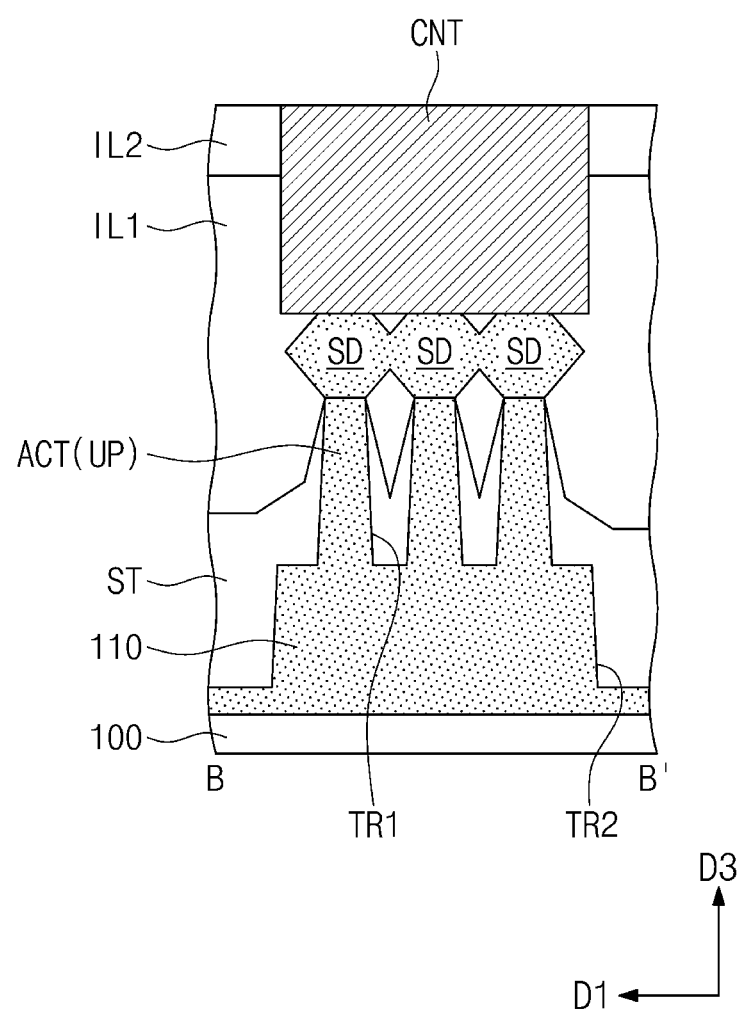
Figure 25C:
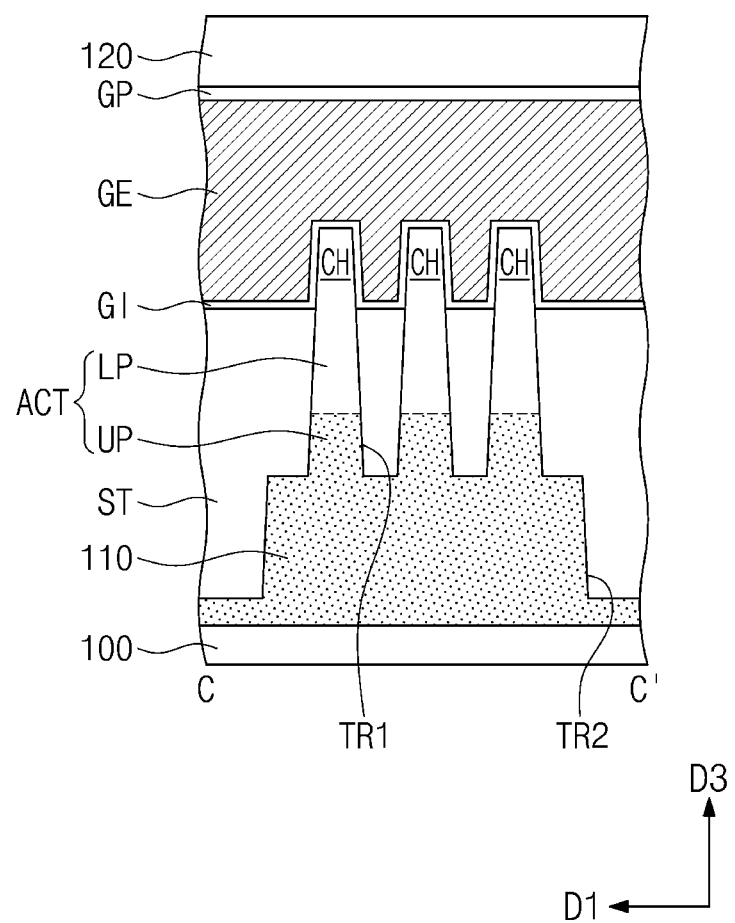

FIG. 24 illustrates a plan view showing a semiconductor device according to exemplary embodiments of inventive concepts. FIGS. 25A, 25B, and 25C illustrate cross-sectional views respectively taken along lines A-A', B-B', and C-C' of FIG. 24.

Referring to FIGS. 24 and 25A to 25C, a substrate 100 may be provided to include a logic cell region. The logic cell region may be provided with logic transistors constituting a logic circuit of a semiconductor device. A first semiconductor layer 110 may be provided on the substrate 100. The first semiconductor layer 110 may include an amorphous oxide semiconductor.

The first semiconductor layer 110 may be provided thereon with a device isolation layer ST defining active patterns ACT. A first trench TR1 may be defined between the active patterns ACT. A second trench TR2 may be defined adjacent to the active patterns ACT. The second trench TR2 may be deeper than the first trench TR1.

The device isolation layer ST may fill the first and second trenches TR1 and TR2. The active patterns ACT may have upper portions that vertically protrude beyond the device isolation layer ST. Each of the upper portions of the active patterns ACT may have a fin shape.

Each of the active patterns ACT may include a first segment LP and a second segment UP. For example, the second segment UP may have an oxygen concentration greater than that of the first segment LP. The second segment UP may have a threshold voltage greater than that of the first segment LP.

Source/drain regions SD may be provided on the upper portions of the active patterns ACT. The source/drain regions SD may be provided on the second segment UP of the active pattern ACT. The source/drain regions SD may be epitaxial patterns formed by a selective epitaxial growth process. A channel region CH may be defined between a pair of source/drain regions SD. The first segment LP of the active pattern ACT may include the channel region CH.

The first semiconductor layer 110 may be configured in such a way that the second segment UP has a ratio (e.g., volume ratio) greater than that of the first segment LP. The second segment UP may surround the first segment LP. According to some exemplary embodiments of inventive concepts, the second segment UP of the active pattern ACT may have a relatively high threshold voltage. As a result, the second segment UP may prevent a current leakage.

Gate electrodes GE may be provided to run across the active patterns ACT and to extend in a first direction D1. The gate electrodes GE may be spaced apart from each other in a second direction D2. The gate electrodes GE may vertically overlap the channel regions CH. For example, the gate electrodes GE may include one or more of metal and conductive metal nitride.

A pair of gate spacers GS may be disposed on opposite sidewalls of each of the gate electrodes GE. The gate spacers GS may include one or more of a silicon oxide layer, a silicon nitride layer, and a silicon oxynitride layer. A gate dielectric layer GI may be interposed between the gate electrode GE and the active pattern ACT. The gate dielectric layer GI may include a high-k dielectric material. A gate capping layer GP may be provided on each of the gate electrodes GE. The gate capping layer GP may include one or more of a silicon oxide layer, a silicon nitride layer, and a silicon oxynitride layer.

A first interlayer dielectric layer IL1 may be provided on the substrate 100. The first interlayer dielectric layer IL1 may cover the gate spacers GS and the source/drain regions SD. A second interlayer dielectric layer IL2 may be provided on the first interlayer dielectric layer IL1. For example, the first and second interlayer dielectric layers IL1 and IL2 may include silicon oxide layers.

A pair of gate electrodes GE may be provided therebetween with one or more contacts AC that penetrate the first and second interlayer dielectric layers IL1 and IL2 and are electrically connected to the source/drain regions SD. The contact CNT may include one or more of metal and conductive metal nitride.

According to other exemplary embodiments of inventive concepts, the second segment UP may have an oxygen concentration less than that of the first segment LP. For example, the second segment UP may have a threshold voltage less than that of the first segment LP. As a result, the second segment UP may generate a current boosting effect.

A semiconductor device according to inventive concepts may include an active pattern consisting of an amorphous oxide semiconductor. An oxygen concentration in the active pattern may be changed to prevent a current leakage and to generate a current boosting effect, which may result in improving electrical characteristics of the semiconductor device.

Although the present invention has been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts.

What is claimed:

1. A method of forming a semiconductor device comprising:
    forming a lower oxide semiconductor layer having a first atomic concentration of oxygen on a semiconductor substrate by sputtering a target including an amorphous oxide semiconductor in a chamber at a first partial pressure of oxygen;
    forming an upper oxide semiconductor layer having a second atomic concentration of oxygen that is greater than the first atomic concentration of oxygen, on the lower oxide semiconductor layer by sputtering the target in the chamber at a second partial pressure of oxygen that is greater than the first partial pressure of oxygen, and
    forming active patterns in the lower oxide semiconductor layer and the upper oxide semiconductor layer by patterning the upper oxide semiconductor layer and the lower oxide semiconductor layer such that each active pattern comprises:
        a lower portion having the first atomic concentration of oxygen, and
        an upper portion having the second atomic concentration of oxygen that is greater than the first atomic concentration of oxygen,
    wherein the lower portion forms a channel region and the upper portion forms a source/drain region.

2. The method of claim 1, further comprising:
    forming an isolation layer on the semiconductor substrate between the active patterns;
    forming at least one trench in at least one active pattern of the active pattern; and
    forming at least one gate electrode in the at least one trench to define at least one recessed gate electrode in the at least one active pattern.

3. The method of claim 2, wherein the at least one trench is formed to extend through the upper oxide semiconductor layer into the lower oxide semiconductor layer.

4. The method of claim 2, wherein the forming the isolation layer on the semiconductor substrate between the active patterns comprises:
    forming a first isolation trench extending through the upper oxide semiconductor layer into the lower oxide semiconductor layer.

5. The method of claim 4 further comprising:
    forming the isolation layer in the first isolation trench; and
    forming a pass transistor gate electrode in the isolation layer adjacent to the at least one gate electrode.

6. The method of claim 4, wherein the upper oxide semiconductor layer comprises a first upper oxide semiconductor layer, and
    wherein the forming the isolation layer on the semiconductor substrate comprises:
    forming a second isolation trench to extend through the first upper oxide semiconductor layer into the lower oxide semiconductor layer;
    forming a second upper oxide semiconductor layer in the second isolation trench;
    forming recesses to extend through the first upper oxide semiconductor layer into the second isolation trench;
    forming the isolation layer in the second isolation trench to maintain a portion of the second upper oxide semiconductor layer on a side wall of the second isolation trench; and
    forming a pass transistor gate electrode in the isolation layer adjacent to the gate electrodes.

7. The method of claim 1, wherein the upper oxide semiconductor layer comprises InGaZnO and the second atomic concentration of oxygen is about 4.1 and the lower oxide semiconductor layer comprises InGaZnO and the first atomic concentration of oxygen is about 3.8.

8. The method of claim 1, wherein oxide semiconductor layer includes a single metal and oxygen.

9. The method of claim 8, wherein the single metal comprises a plurality of metals selected from a group consisting of In, Zn, Sn, Al, Mg, Ga, Hf, La, Ce, Pr, Nd, Sm, Eu, Gd, Tb, Dy, Ho, Er, Tm, Yb, and Lu.

10. The method of claim 2, wherein the forming the at least one gate electrode further comprises:
    forming a metal gate layer in the at least one trench;
    forming a polysilicon high-work function layer on the metal gate layer; and
    forming a gate capping layer on the polysilicon high-work function layer.

11. A method of forming a semiconductor device comprising:
    forming a lower oxide semiconductor layer having a first atomic concentration of oxygen on a semiconductor substrate by sputtering a target including an amorphous oxide semiconductor in a chamber at a first partial pressure of oxygen;
    forming an upper oxide semiconductor layer having a second atomic concentration of oxygen that is greater than the first atomic concentration of oxygen, on the lower oxide semiconductor layer by sputtering the target in the chamber at a second partial pressure of oxygen that is greater than the first partial pressure of oxygen;
    forming at least one active pattern in the lower oxide semiconductor layer and the upper oxide semiconductor layer by patterning the upper oxide semiconductor layer and the lower oxide semiconductor layer; and
    forming a trench in the at least one active pattern that extends through the upper oxide semiconductor layer into the lower oxide semiconductor layer,
    wherein the lower portion forms a channel region and the upper portion forms a source/drain region.

12. The method of claim 11, further comprising:
 forming an isolation layer on the semiconductor substrate, the isolation layer covering the at least one active pattern; and
 forming a gate electrode in the trench to define a recessed gate electrode in the at least one active pattern.

13. The method of claim 12, wherein the forming the gate electrode further comprises:
 forming a metal gate layer in the trench;
 forming a polysilicon high-work function layer on the metal gate layer; and
 forming a gate capping layer on the polysilicon high-work function layer.

14. The method of claim 11, wherein the upper oxide semiconductor layer comprises InGaZnO and the second atomic concentration of oxygen is about 4.1 and the lower oxide semiconductor layer comprises InGaZnO and the first atomic concentration of oxygen is about 3.8.

15. The method of claim 11, wherein oxide semiconductor layer includes a single metal and oxygen.

16. The method of claim 15, wherein the single metal comprises a plurality of metals selected from a group consisting of In, Zn, Sn, Al, Mg, Ga, Hf, La, Ce, Pr, Nd, Sm, Eu, Gd, Tb, Dy, Ho, Er, Tm, Yb, and Lu.

* * * * *